(12) United States Patent
Arai

(10) Patent No.: US 12,349,355 B2
(45) Date of Patent: Jul. 1, 2025

(54) THREE-DIMENSIONAL SEMICONDUCTOR MEMORY DEVICE

(71) Applicant: KIOXIA CORPORATION, Tokyo (JP)

(72) Inventor: Shinya Arai, Yokkaichi (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 18/456,927

(22) Filed: Aug. 28, 2023

(65) Prior Publication Data

US 2023/0403857 A1 Dec. 14, 2023

Related U.S. Application Data

(63) Continuation of application No. 17/848,789, filed on Jun. 24, 2022, now Pat. No. 11,778,828, which is a (Continued)

(51) Int. Cl.

| | |
|---|---|
| *H10B 43/27* | (2023.01) |
| *H01L 23/528* | (2006.01) |
| *H01L 23/532* | (2006.01) |
| *H10B 43/10* | (2023.01) |
| *H10B 43/20* | (2023.01) |
| *H10D 30/69* | (2025.01) |
| *H10D 62/10* | (2025.01) |

(Continued)

(52) U.S. Cl.
CPC .......... *H10B 43/27* (2023.02); *H01L 23/528* (2013.01); *H01L 23/53257* (2013.01); *H01L 23/53271* (2013.01); *H10B 43/10* (2023.02); *H10B 43/20* (2023.02); *H10D 30/69* (2025.01); *H10D 62/115* (2025.01); *H10D 62/151* (2025.01); *H10D 64/62* (2025.01)

(58) Field of Classification Search
CPC ........ H10B 43/27; H10B 43/20; H10B 43/10; H01L 23/528; H10L 23/53257; H10L 23/53271; H10L 29/0649; H10L 29/0847; H10L 29/45; H10L 29/792
USPC ........................................................ 257/324
See application file for complete search history.

(56) References Cited

U.S. PATENT DOCUMENTS

| | | |
|---|---|---|
| 8,148,769 B2 | 4/2012 | Kito |
| 8,912,593 B2 | 12/2014 | Matsuda |

(Continued)

*Primary Examiner* — Xia L Cross
(74) *Attorney, Agent, or Firm* — Oblon, McClelland, Maier & Neustadt, L.L.P.

(57) ABSTRACT

According to one embodiment, a semiconductor memory device includes a substrate; an insulating layer provided on the substrate; a conductive layer provided on the insulating layer; a stacked body provided on the conductive layer and including a plurality of electrode layers and a plurality of insulating layers respectively provided among the plurality of electrode layers; a columnar section piercing through the stacked body to reach the conductive layer and extending in a first direction in which the stacked body is stacked; and a source layer. The columnar section includes a channel body and a charge storage film provided between the channel body and the respective electrode layers. The conductive layer includes a first film having electric conductivity and in contact with the lower end portion of the channel body; and an air gap provided to be covered by the first film.

20 Claims, 21 Drawing Sheets

Related U.S. Application Data continuation of application No. 17/011,517, filed on Sep. 3, 2020, now Pat. No. 11,417,679, which is a continuation of application No. 16/137,702, filed on Sep. 21, 2018, now Pat. No. 10,804,288, which is a continuation of application No. 15/344,021, filed on Nov. 4, 2016, now Pat. No. 10,109,643, which is a continuation of application No. 14/597,580, filed on Jan. 15, 2015, now Pat. No. 9,524,979.

(60) Provisional application No. 62/047,369, filed on Sep. 8, 2014.

(51) Int. Cl.
*H10D 62/13* (2025.01)
*H10D 64/62* (2025.01)

(56) References Cited

U.S. PATENT DOCUMENTS

| | | |
|---|---|---|
| 2010/0144133 A1 | 6/2010 | Nomura |
| 2010/0244119 A1 | 9/2010 | Fukuzumi |
| 2010/0327339 A1* | 12/2010 | Tanaka .................. H10B 43/20 257/E21.679 |
| 2012/0241842 A1 | 9/2012 | Matsuda |
| 2012/0241844 A1 | 9/2012 | Iguchi et al. |
| 2013/0214344 A1 | 8/2013 | Lim |
| 2013/0221343 A1 | 8/2013 | Son |
| 2013/0228852 A1 | 9/2013 | Kitazaki et al. |
| 2013/0264626 A1 | 10/2013 | Sawa |
| 2015/0221667 A1 | 8/2015 | Fukuzumi et al. |

* cited by examiner

THREE-DIMENSIONAL SEMICONDUCTOR MEMORY DEVICE

CROSS-REFERENCE TO RELATED APPLICATIONS

This application is a continuation of and claims benefit under U.S.C. § 120 to U.S. application Ser. No. 17/848,789, filed Jun. 24, 2022, which is a continuation of and claims benefit under 35 U.S.C. § 120 to U.S. application Ser. No. 17/011,517, filed Sep. 3, 2020 (now U.S. Pat. No. 11,417,679), which is a continuation of and claims benefit under 35 U.S.C. § 120 to U.S. application Ser. No. 16/137,702, filed Sep. 21, 2018 (now U.S. Pat. No. 10,804,288), which is a continuation of and claims benefit under 35 U.S.C. § 120 to U.S. application Ser. No. 15/344,021, filed Nov. 4, 2016 (now U.S. Pat. No. 10,109,643), which is a continuation of and claims benefit under 35 U.S.C. § 120 to U.S. application Ser. No. 14/597,580, filed Jan. 15, 2015 (now U.S. Pat. No. 9,524,979) which is based upon and claims benefit under 35 U.S.C. § 119(e) to U.S. Provisional Patent Application No. 62/047,369, filed on Sep. 8, 2014, the entire contents of each of which are incorporated herein by reference.

FIELD

Embodiments described herein relate generally to a semiconductor memory device and a method for manufacturing same.

BACKGROUND

A memory device having a three-dimensional structure has been proposed in which a memory hole is formed in a stacked body formed by stacking a plurality of electrode layers, which function as control gates in memory cells, via insulating layers and a silicon body, which functions as a channel, is provided on a sidewall of the memory hole via a charge storage film.

According to refining of the memory cells, it is likely that deterioration in reliability of the memory cells is caused. Further, contact formation of the channel could be difficult.

DETAILED DESCRIPTION

Figure 1:
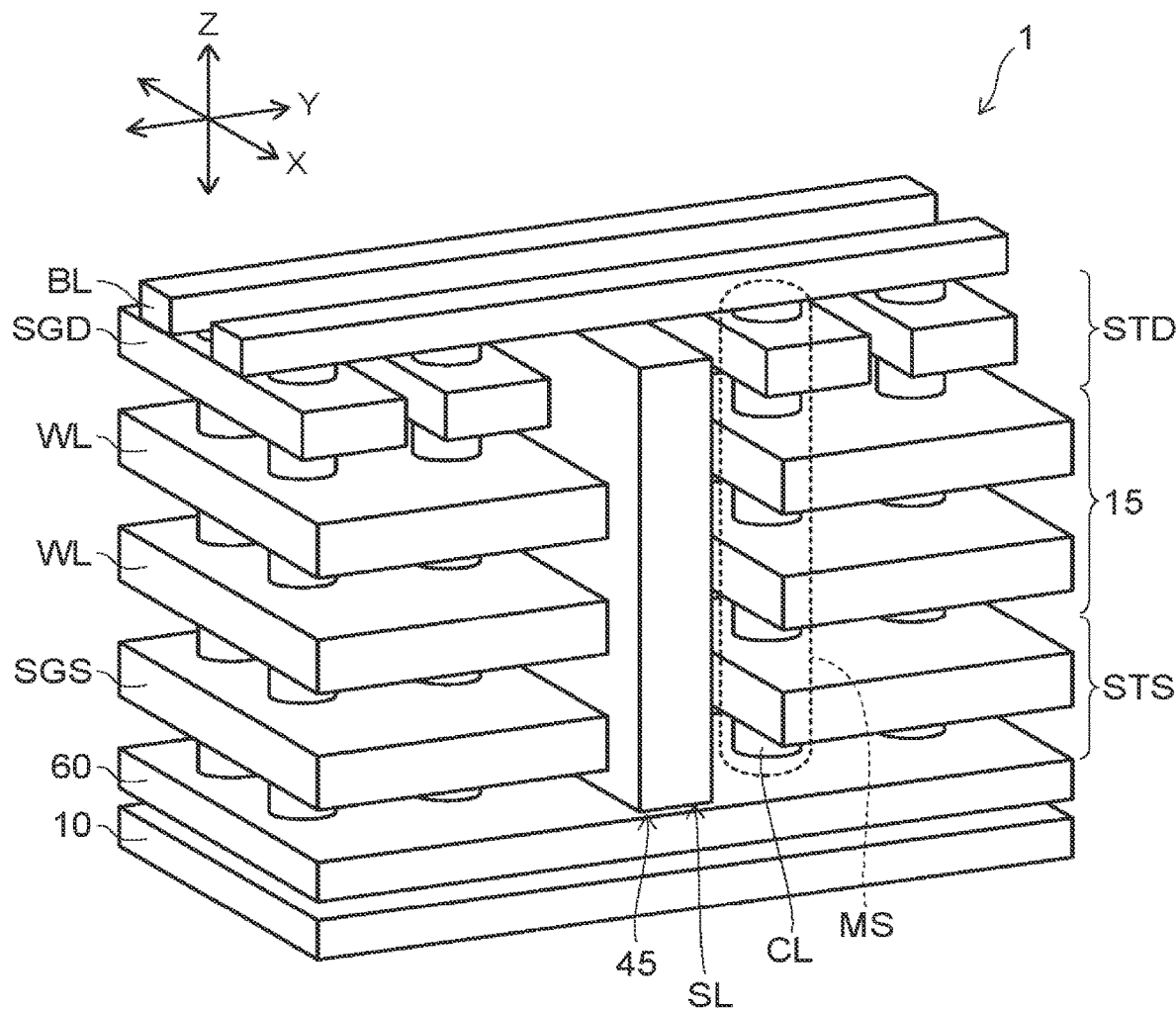
FIG. 1 is a schematic perspective view of a memory cell array in an embodiment.

According to one embodiment, a semiconductor memory device includes a substrate; an insulating layer provided on the substrate; a conductive layer provided on the insulating layer; a stacked body provided on the conductive layer and including a plurality of electrode layers and a plurality of insulating layers respectively provided among the plurality of electrode layers; a columnar section piercing through the stacked body to reach the conductive layer and extending in a first direction in which the stacked body is stacked; and a source layer piercing through the stacked body to reach the conductive layer and extending in the first direction and a second direction that crosses the first direction. The columnar section includes a channel body including a lower end portion projecting into the conductive layer, electrically connected to the source layer via the conductive layer, and extending in the first direction; and a charge storage film provided between the channel body and the respective electrode layers. The conductive layer includes a first film having electric conductivity and in contact with the lower end portion of the channel body; and an air gap provided to be covered by the first film.

Embodiments are described below with reference to the drawings. Note that, in the drawings, the same elements are denoted by the same reference numerals and signs.

FIG. 1 is a schematic perspective view of a memory cell array 1 in an embodiment. Note that, in FIG. 1, insulating layer and the like are not shown to clearly show the figure.

In FIG. 1, two directions parallel to a major surface of a substrate 10 and orthogonal to each other are referred to as X-direction and Y-direction. A direction perpendicular to both of the X-direction and the Y-direction is referred to as Z-direction (stacking direction).

The memory cell array 1 includes a plurality of memory strings MS.

Figure 2A:
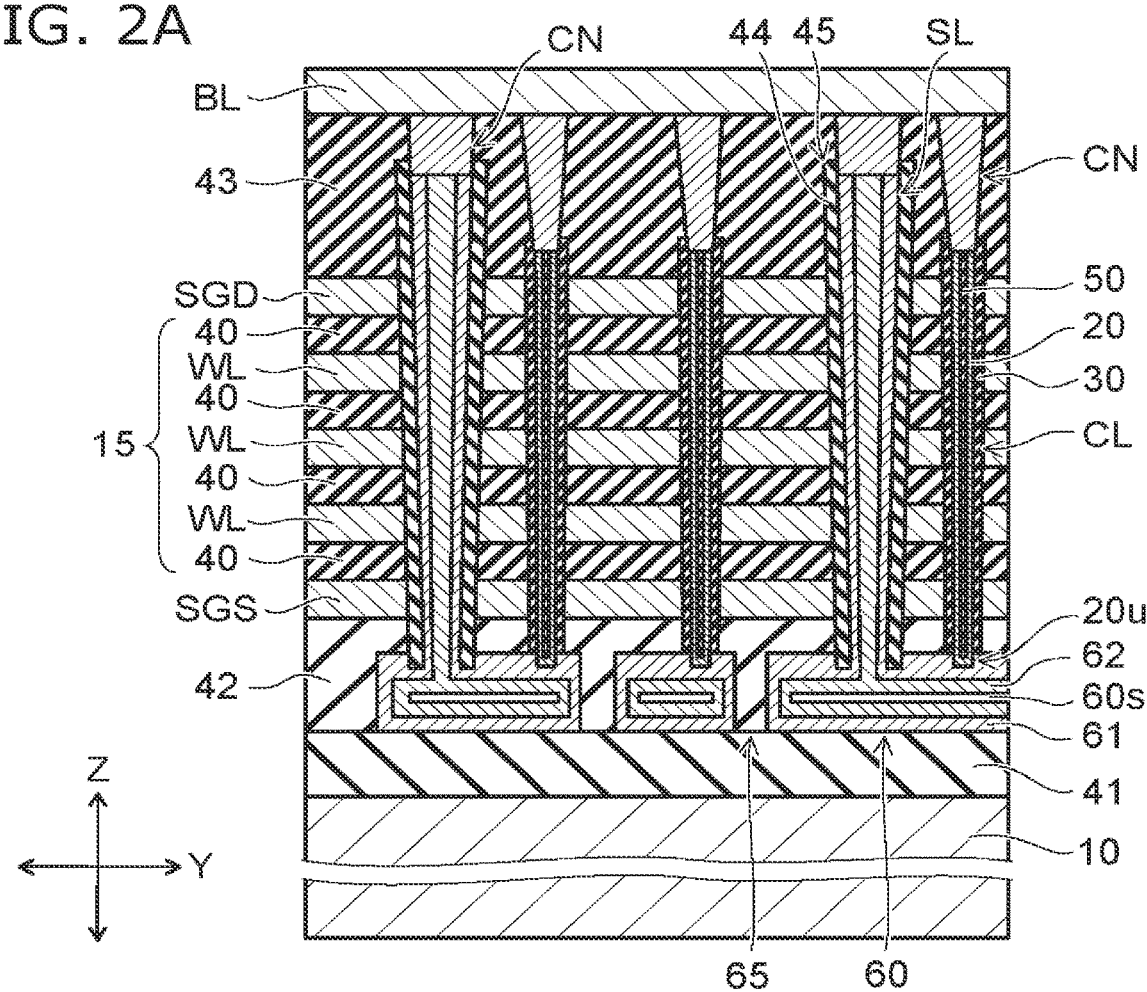
FIG. 2A is a schematic sectional view of the memory strings in the embodiment and FIG. 2B is a schematic top view of the memory strings in the embodiment.

FIG. 2A is a schematic sectional view of the memory strings MS. FIG. 2A shows a cross section parallel to a YZ plane in FIG. 1.

Figure 2B:
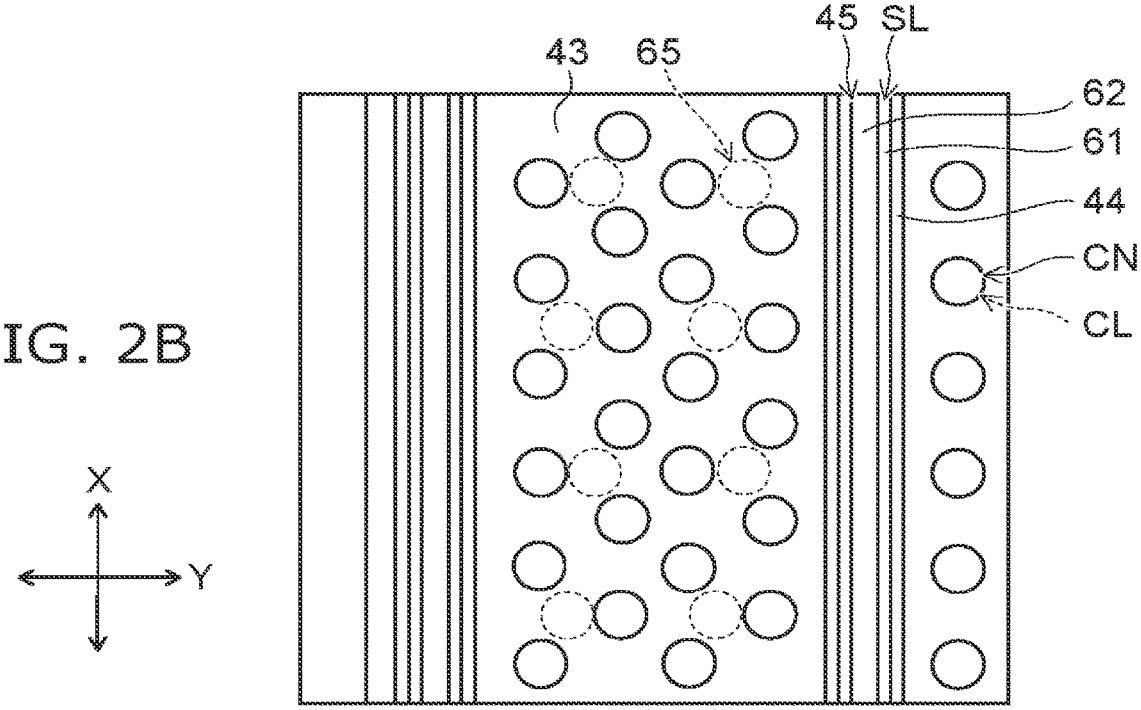

FIG. 2B is a schematic top view of the memory strings MS. FIG. 2B shows a top surface parallel to an XY plane in FIG. 1.

A source side selection gate SGS is provided on the substrate 10 via conductive layer 60. An insulating layer is provided on the source side selection gate SGS. A stacked body 15 in which a plurality of electrode layers WL and a plurality of interlayer insulating layers 40 are alternately stacked one by one is provided on the insulating layer. Note that the number of the electrode layers WL shown in the figure is an example. The number of the electrode layers WL may be any number. For example, the plurality of electrode layers WL is stacked and separated from each other. The plurality of interlayer insulating layers 40 includes an air gap.

The interlayer insulating layer 40 is provided on the top electrode layer WL. A drain side selection gate SGD is provided on the insulating layer.

The source side selection gate SGS, the drain side selection gate SGD, and the electrode layers WL are, for example, silicon layers including silicon as a main component. For example, boron is doped in the silicon layers as impurities for giving electric conductivity. The source side selection gate SGS, the drain side selection gate SGD, and the electrode layers WL may include at least one of metal or metal silicide. As the interlayer insulating layer 40, for example, insulating film mainly including silicon oxide is used.

The thickness of the drain side selection gate SGD and the source side selection gate SGS is, for example, thicker than one electrode layer WL. For example, a plurality of the drain side selection gates SGD and a plurality of the source side selection gates SGS may be provided. The thickness of the drain side selection gate SGD and the source side selection gate SGS may be equal to or thinner than the thickness of one electrode layer WL. In this case, as described above, the drain side selection gate SGD and the source side selection gate SGS may be provided in a plurality. Here, the term "thickness" used herein refers to the thickness in the stacking direction (Z-direction) of the stacked body 15.

In the stacked body 15, columnar section CL extending in the Z-direction is provided. The columnar section CL pierces through the stacked body 15. The columnar section CL is formed in, for example, a columnar or elliptic columnar shape. The columnar section CL is electrically connected to the conductive layer 60.

In the stacked body 15, groove ST piercing through the stacked body 15 and extending in the X-axis direction are provided. Source layer SL is provided in the groove ST. Side surface of the source layer SL is covered by insulating film 44. Like the groove ST, the source layer SL extends in the X-axis direction. As the source layer SL, a material having electric conductivity (e.g., tungsten) is used.

The lower end of the source layer SL is electrically connected to channel body 20 (semiconductor body) of the columnar section CL via the conductive layer 60. The upper end of the source layer SL is electrically connected to a not-shown control circuit.

For example, the source layer SL may be provided between the substrate 10 and the conductive layer 60. In this case, not-shown contact layer is provided in the groove ST. The source layer SL is electrically connected to the control circuit via the contact layer. The insulating layer 44 may be embedded in the groove ST.

Figure 3:
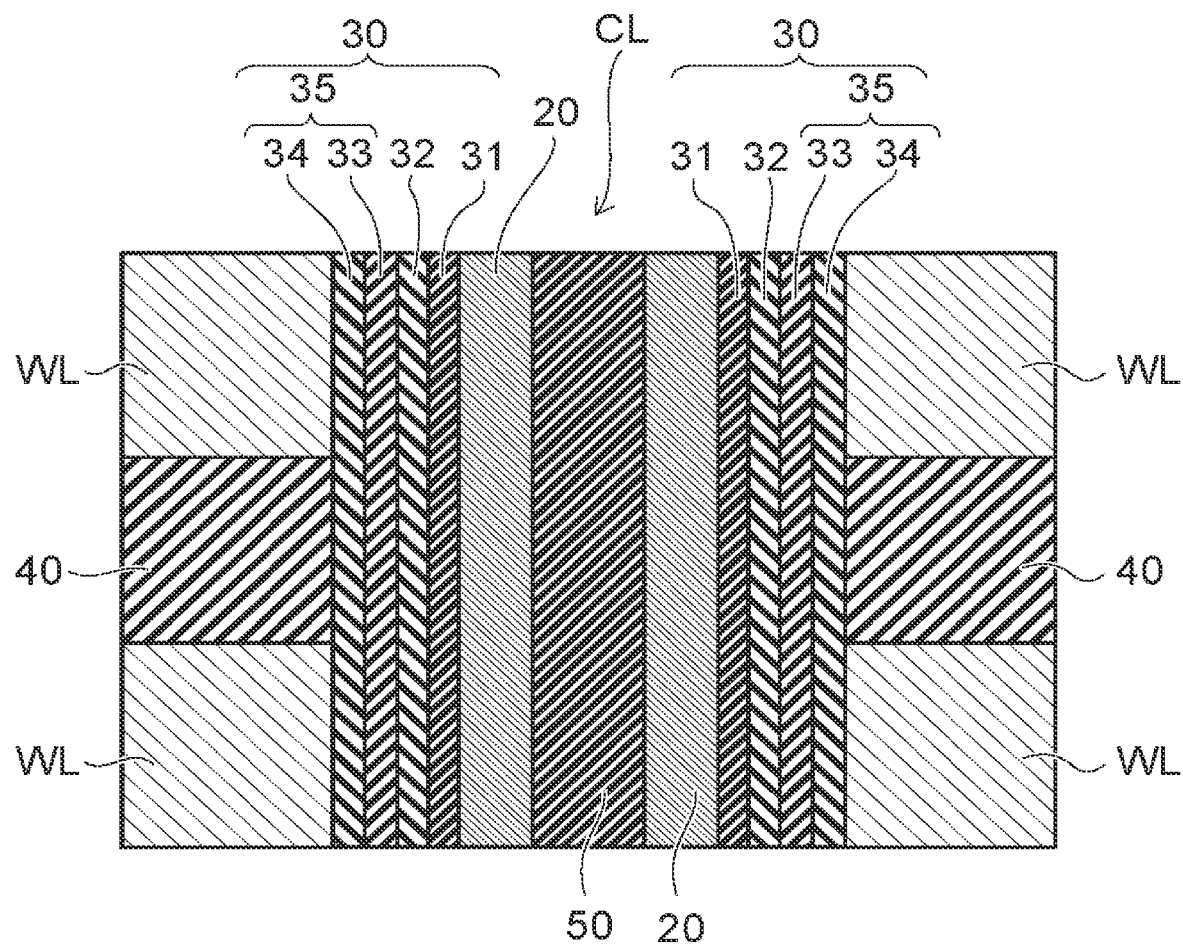
FIG. 3 is an enlarged schematic sectional view of a part of the columnar section of the embodiment.

FIG. 3 is an enlarged schematic sectional view of a part of the columnar section CL in the embodiment.

The columnar section CL is formed in a memory hole formed in the stacked body 15 including the plurality of electrode layers WL and the plurality of interlayer insulating layers 40. The channel body 20 functioning as semiconductor channels is provided in the memory hole. The channel body 20 is, for example, silicon film including silicon as a main component.

The channel body 20 is provided in a cylindrical shape extending in the stacking direction of the stacked body 15. The upper end of the channel body 20 is connected to bit line BL (interconnects) shown in FIG. 1. The lower end side of the channel body 20 is connected to the conductive layer 60. The bit line BL extends in the Y-direction.

Memory film 30 is provided between the electrode layer WL and the channel body 20. The memory film 30 include block insulating film 35, charge storage film 32, and tunnel insulating film 31.

The block insulating film 35, the charge storage film 32, and the tunnel insulating film 31 are provided in order from the electrode layer WL side between the electrode layer WL and the channel body 20. The block insulating film 35 is in contact with the electrode layer WL. The tunnel insulating film 31 is in contact with the channel body 20. The charge storage film 32 is provided between the block insulating film 35 and the tunnel insulating film 31.

The electrode layer WL surrounds the channel body 20 via the memory film 30. A core insulating film 50 is provided on the inner side of the channel body 20.

The channel body 20 functions as channel in memory cells. The electrode layer WL functions as control gate of the memory cells. The charge storage film 32 functions as data memory layer that stores charges injected from the channel body 20. That is, memory cells having structure in which the control gate surrounds the channel is formed in crossing portion of the channel body 20 and the electrode layer WL.

As shown in FIG. 2A, an insulating layer 43 is provided on the drain side selection gate SGD. The bit line BL is provided on the insulating layer 43. The bit line BL is connected to the upper end of the channel body 20 via contact plug CN piercing through the insulating layer 43. The upper end of the source layer SL is connected to not-shown source interconnects.

A semiconductor memory device in the embodiment can electrically freely perform erasing and writing of data and can retain stored contents even if a power supply is turned off.

The memory cell is, for example, a charge trap type. The charge storage film 32 includes a large number of trap sites for capturing charges and is silicon nitride film, for example.

The tunnel insulating film 31 functions as potential barrier when charges are injected to the charge storage film 32 from the channel body 20 or when charges stored in the charge storage film 32 diffuse to the channel bodies 20. The tunnel insulating films 31 are, for example, silicon oxide films.

As the tunnel insulting film 31, laminated film (ONO film) formed by sandwiching a silicon nitride film with a pair of silicon oxide films may be used. When the ONO film is used as the tunnel insulating film 31, it is possible to perform an erasing operation in a low electric field compared with a single layer of a silicon oxide film.

The block insulating film 35 prevents the charges stored in the charge storage film 32 from diffusing to the electrode layer WL. The block insulating film 35 includes cap film 34 provided in contact with the electrode layer WL and block film 33 provided between the cap film 34 and the charge storage film 32.

The block film 33 is, for example, silicon oxide films. The cap film 34 is a film having a dielectric constant higher than the dielectric constant of silicon oxide and is, for example, at least one of silicon nitride film and aluminum oxide. By providing the cap film 34 in contact with the electrode layer WL, it is possible to suppress back tunneling electron injected from the electrode layer WL during erasing. That is, by using laminated film of silicon oxide film and silicon nitride film as the block insulating film 35, it is possible to improve a charge blocking property.

As shown in FIG. 1, drain side selection transistor STD is provided at the upper end portion of the columnar section CL in the memory string MS. A source side selection transistor STS is provided at the lower end portion of the columnar section CL in the memory string MS.

The memory cells, the drain side selection transistor STD, and the source side selection transistor STS are vertical transistors in which an electric current flows in the stacking direction of the stacked body 15 (the Z-direction).

The drain side selection gate SGD functions as a gate electrode (a control gate) of the drain side selection transistor STD. Insulating film functioning as gate insulating film of the drain side selection transistor STD is provided between the drain side selection gate SGD and the channel body 20.

The source side selection gate SGS functions as a gate electrode (a control gate) of the source side selection transistor STS. Insulating film functioning as gate insulating films of the source side selection transistor STS is provided between the source side selection gate SGS and the channel body 20.

A plurality of memory cells having the respective electrode layers WL as control gates are provided between the drain side selection transistor STD and the source side selection transistor STS.

The plurality of memory cells, the drain side selection transistor STD, and the source side selection transistor STS are connected in series through the channel body 20 and configure one memory string MS. A plurality of the memory strings MS are arrayed in the X-direction and the Y-direction, whereby the plurality of memory cells are three-dimensionally provided in the X-direction, the Y-direction, and the Z-direction.

As shown in FIG. 2A, on the substrate 10, the conductive layer 60 and the insulating layer 42 are provided via the insulating layer 41. The conductive layer 60 is provided in the insulating layer 42. The conductive layer 60 includes first films 61, second films 62, and air gap 60s.

As the first film 61, for example, polysilicon film is used and n-type polysilicon doped with arsenic or the like is used. As the second film 62, for example, tungsten is used.

The first film 61 is provided on side surface side of the conductive layer 60. The second film 62 is provided on the inner side of the first film 61. The air gap 60s is provided on the inner side of the second film 62 and is entirely surrounded and covered by the second film 62.

Lower end portion 20u of the channel body 20 projects to the conductive layer 60. The lower end portion 20u of the channel body 20 has end face (bottom surface) and side surface not covered by the memory film 30. That is, the lower end portion of the columnar section CL is formed in a wedge shape having the channel body 20 as the distal end.

The lower end portion 20u of the channel body 20 is in contact with the first film 61. The lower end portion 20u of the channel body 20 is covered by the first film 61 and covered by the second film 62 via the first film 61. That is, the channel body 20 is electrically connected to the first film 61 and the second film 62 via the lower end portion 20u.

According to the embodiment, the channel body 20 is in contact with the conductive layer 60 not only on the end face (the bottom surface) of the lower end portion 20u but also on the side surface. Therefore, the area of the channel body 20 in contact with the conductive layer 60 is large and contact resistance decreases.

Figure 13A:
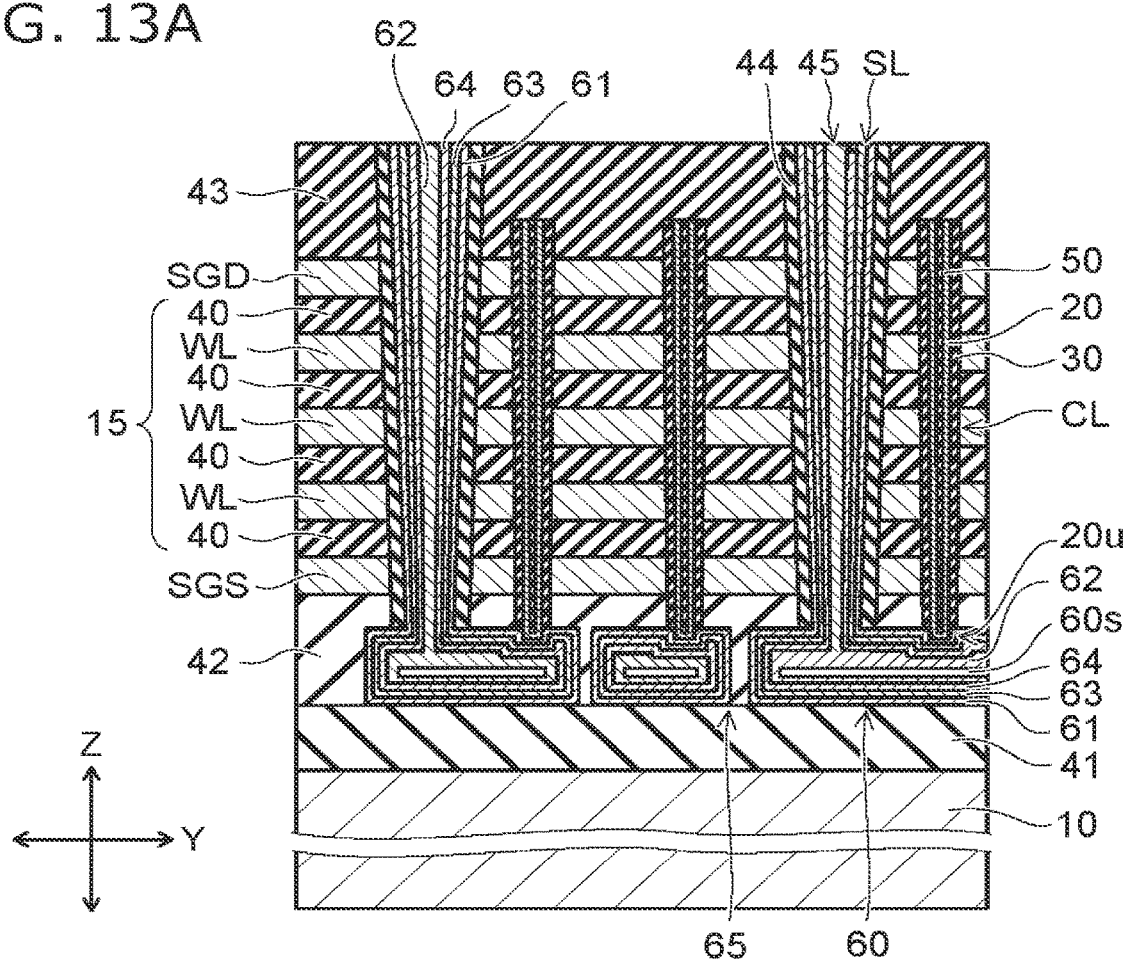
Figure 13B:
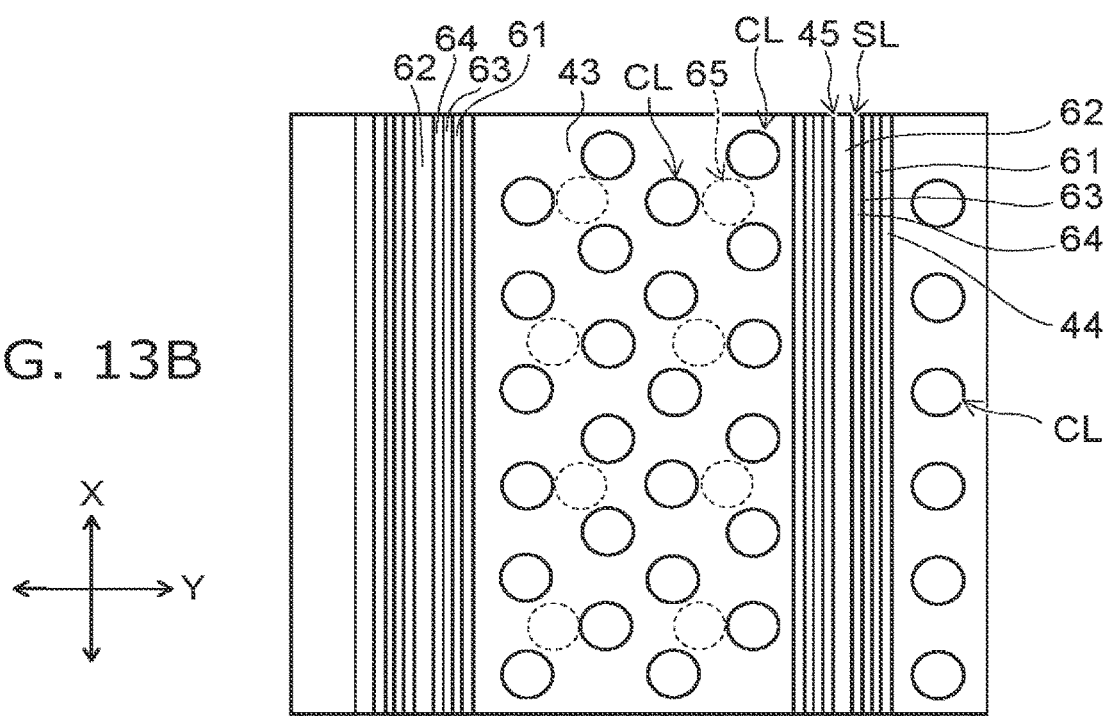

For example, the conductive layer 60 may include first barrier film 63 and second barrier film 64 (FIGS. 13A and 13B). The first barrier film 63 is formed between the first film 61 and the second film 62. The second barrier film 64 is formed between the first barrier film 63 and the second film 62.

As the first barrier film 63, for example, titanium film is used. As the second barrier film 64, for example, titanium nitride film is used. Consequently, it is possible to reduce contact resistance of the first film 61 and the second film 62.

The source layer SL is provided in the groove ST. The source layer SL includes the first film 61 (third film) and the second film 62 (fourth film). That is, as the source layer SL, a material same as the material of the conductive layer 60 is used.

The first film 61 is provided on the side surfaces of the source layer SL and extends in the stacking direction piercing through the stacked body 15. The second film 62 is provided on the inner side of the first film 61. The first film 61 and the second film 62 of the source layer SL are integrally connected to the conductive layer 60.

The insulating film 44 is provided between the side surfaces of the source layer SL and the electrode layer WL of the stacked body 15. Consequently, the source layer SL is not short-circuited with the electrode layer WL. The insulating film 44 is also provided between the source side selection gate SGS and the source layer SL and between the drain side selection gate SGD and the source layer SL.

The first film 61 and the second film 62 are integrally provided in region where the source layer SL and the conductive layer 60 are formed. In region where the slit-like source layer SL is formed, the first film 61 and the second film 62 are provided in order from the side surface side.

The insulating layer 42 includes the column 65. As shown in FIG. 2A, the column 65 is provided on the substrate 10 via the insulating layer 41. The side surface of the conductive layer 60 is in contact with the column 65.

The side surface of the column 65 is covered by the conductive layer 60. The column 65 is provided integrally within an insulating layer 42 on the column 65.

Figure 4A:
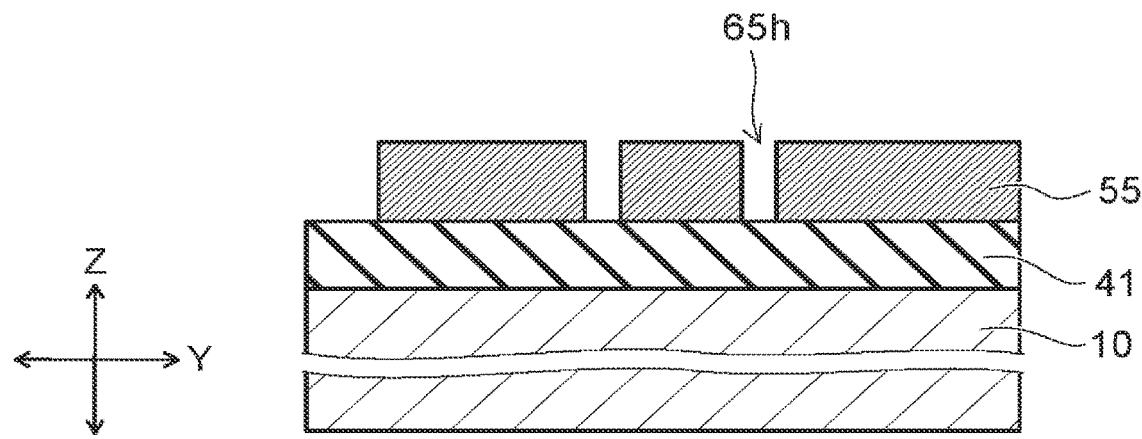
FIG. 4A to FIG. 13B are schematic views showing a method for manufacturing the semiconductor memory device of the embodiment.
Figure 4B:
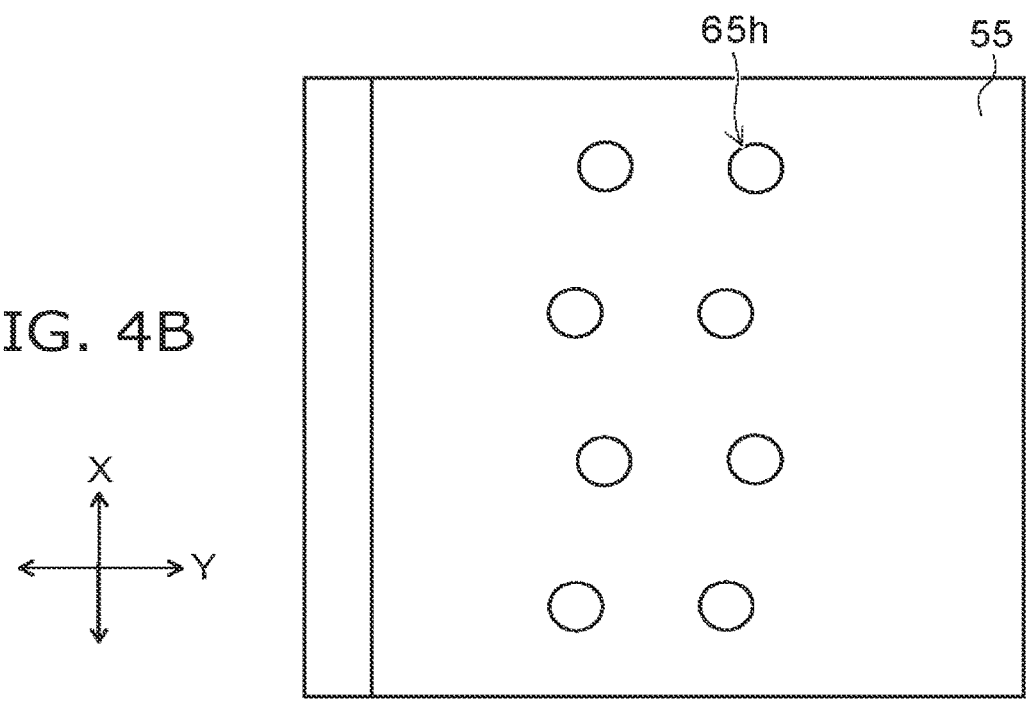

The stacked body 15 is provided on the conductive layer 60 and the column 65 via the insulating layer 42. As described below, a sacrificial layer 55 is once formed in region where the conductive layer 60 is formed (FIG. 4A). After the stacked body 15 is formed on the sacrificial layer 55, the sacrificial layer 55 is removed. When the sacrificial layer 55 is removed, the column 65 supports the stacked body 15.

According to the embodiment, it is possible to realize reliability improvement and refining of the memory cell. Further, it is possible to realize a reduction in a block size and an increase in an electric current. It is possible to perform a high-speed operation.

A method for manufacturing the semiconductor memory device in the embodiment is described with reference to FIGS. 4A to 13B.

FIGS. 4A, 5A, 6A, 7A, 8A, 9A, 10A, 11A, 12A, and 13A are schematic sectional views. FIGS. 4B, 5B, 6B, 7B, 8B, 9B, 10B, 11B, 12B, and 13B are schematic top views of the schematic sectional views.

As shown in FIG. 4A, the insulating layer 41 is formed on the substrate 10. The sacrificial layer 55 is formed on the insulating layer 41. Holes 65h are formed in the sacrificial layer 55. The holes 65h pierce through the sacrificial layer 55.

In a process described below, the sacrificial layer 55 is removed. The conductive layers 60 are formed in portions where the sacrificial layer 55 is removed (a replacing process). As the sacrificial layer 55, for example, at least one of amorphous silicon and a silicon nitride film is used.

Figure 5A:
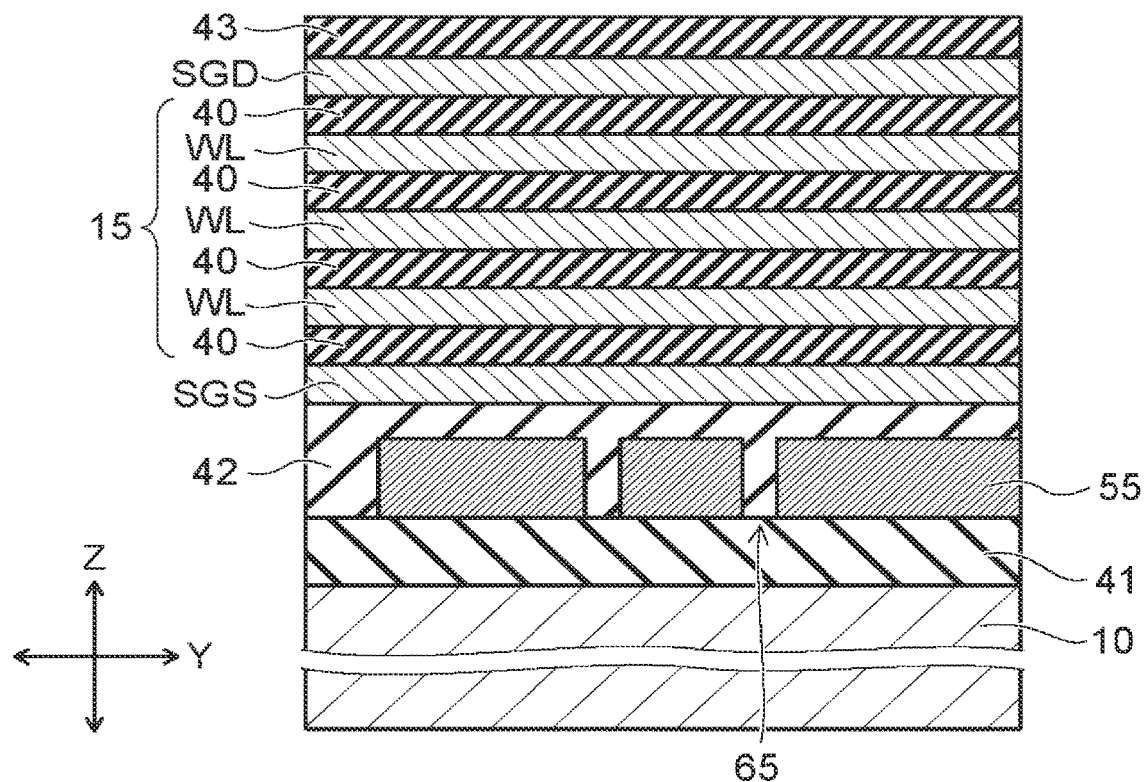
Figure 5B:
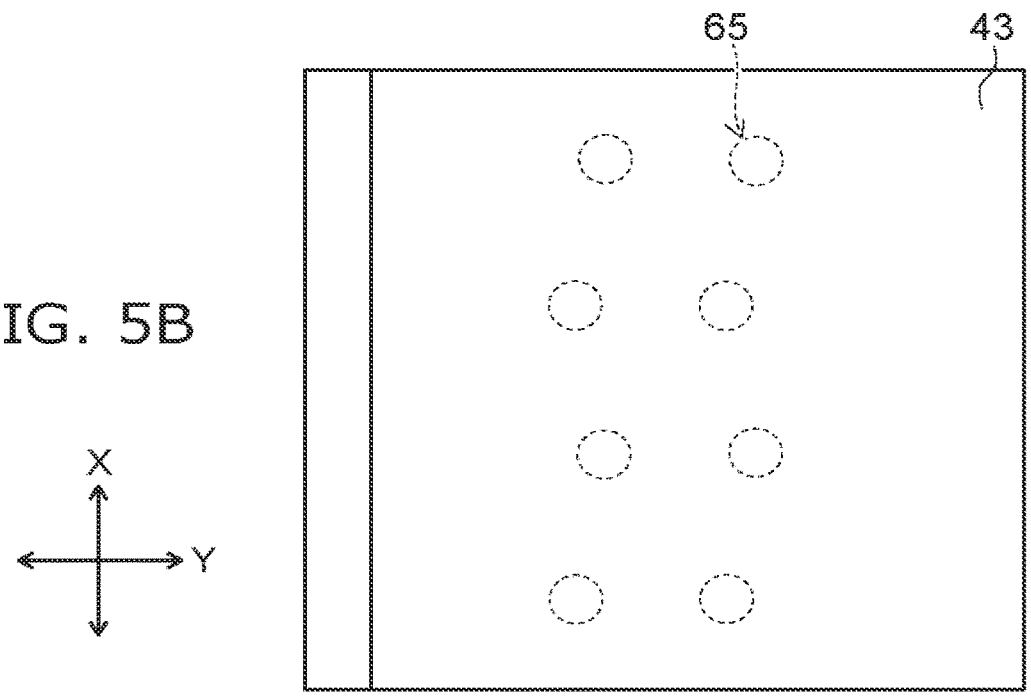

As shown in FIG. 5A, insulating films are embedded in the holes 65h. Consequently, the columns 65 are formed. The sacrificial layer 55 is surrounded and covered by the insulating layer 42. Thereafter, the source side selection gate SGS is formed on the sacrificial layer 55 and the columns 65 via the insulating layer 42. On the source side selection gate SGS, the stacked body 15 in which the interlayer insulating layers 40 and the electrode layers WL are alternately stacked is formed. The drain side selection gate SGD is formed on the top electrode layer WL via the interlayer insulating layer 40. The insulating layer 43 is formed on the drain side selection gate SGD.

Thereafter, a plurality of memory holes MH are formed in the stacked body. The memory holes MH are formed by, for example, an RIE method (Reactive Ion Etching) using a not-shown mask. The memory holes MH pierce through the insulating layer 43 to the insulating layer 42 to reach the sacrificial layer 55.

Figure 6A:
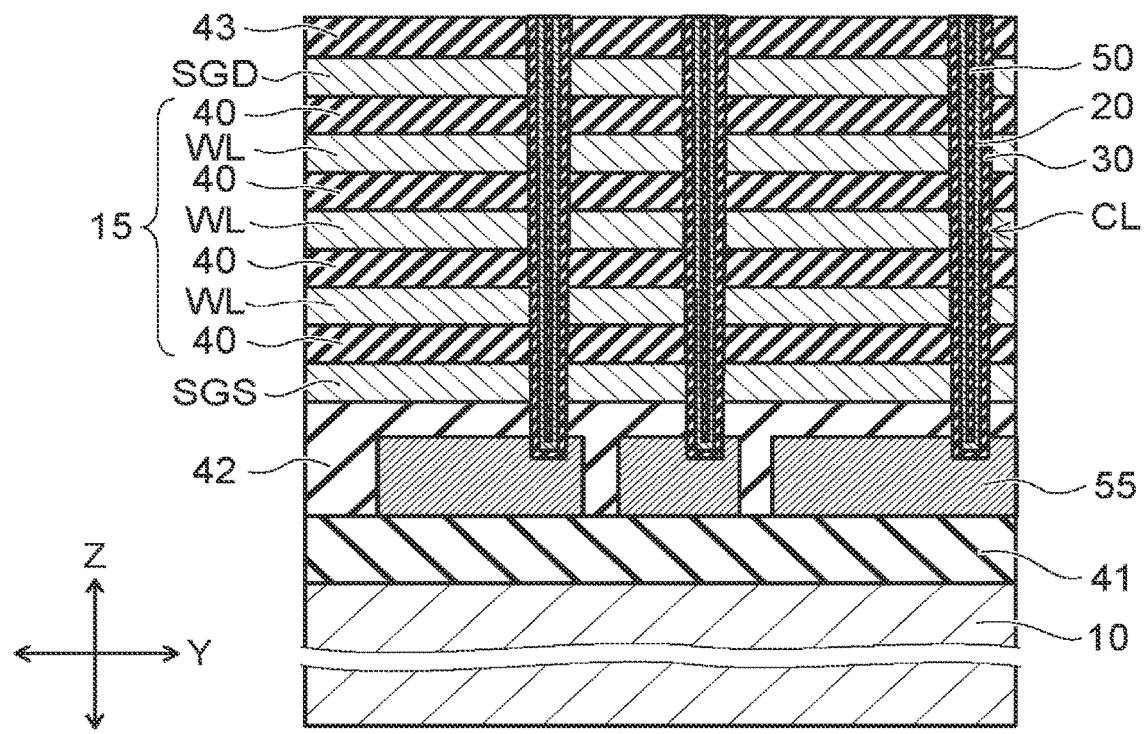

After the memory holes MH are formed, the films (the memory films 30 and the films including the channel bodies 20) shown in FIG. 3 are formed in order on the inner walls (the sidewalls and the bottoms) of the memory holes MH. Thereafter, the respective films formed on the insulating layers 42 are removed. Consequently, as shown in FIG. 6A, the columnar sections CL are formed.

In this case, the lower end portions 20u of the channel bodies 20 project to the sacrificial layer 55 and are covered by the memory films 30. The memory films 30 that cover the lower end portions 20u of the channel bodies 20 are covered by the sacrificial layer 55.

Figure 6B:
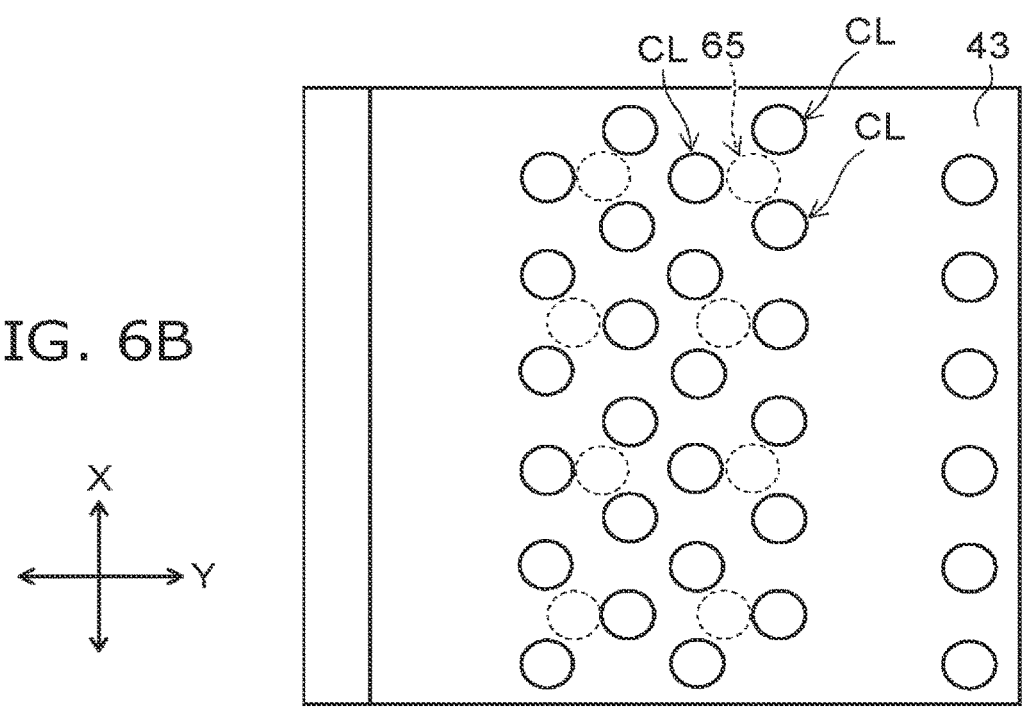

For example, as shown in FIG. 6B, the columnar sections CL are formed to surround the columns 65. The arrangement of the columnar sections CL is arbitrary. The columnar sections CL may overlap the columns 65.

Figure 7A:
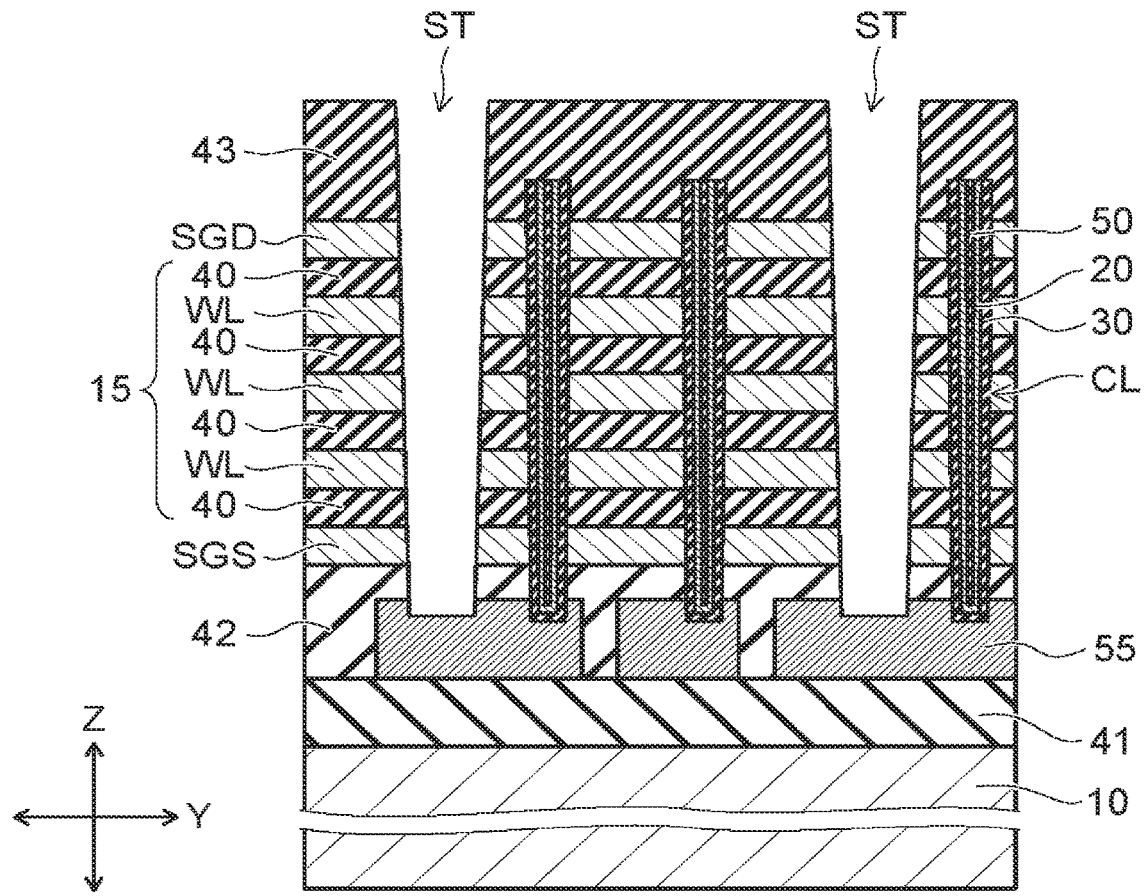
Figure 7B:
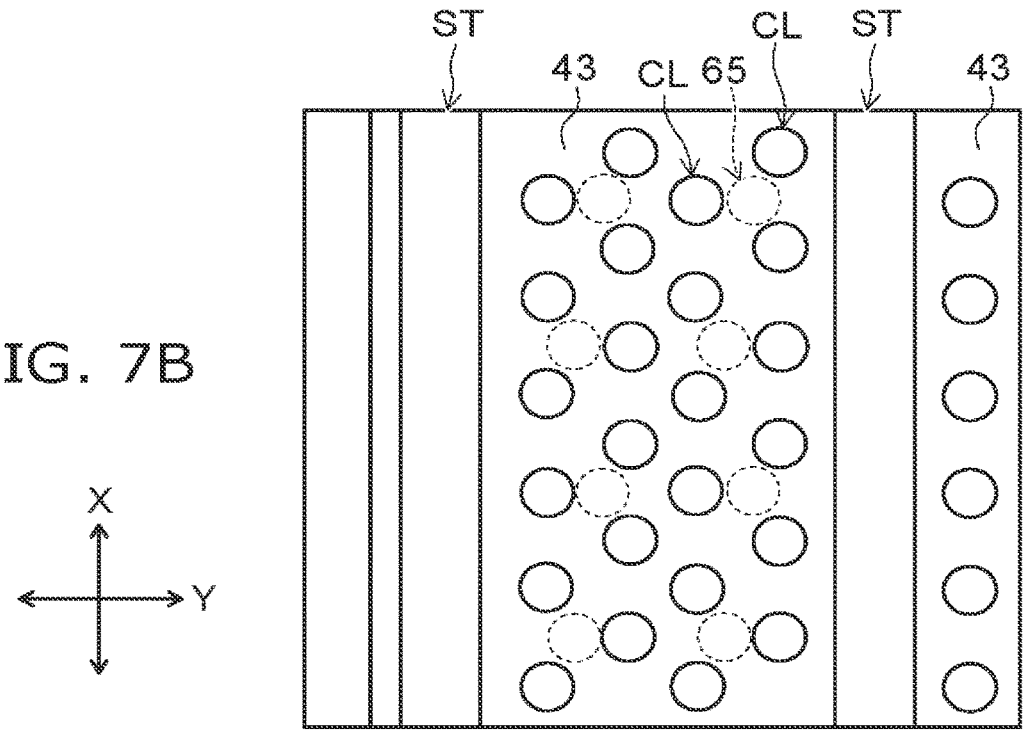

As shown in FIG. 7A, the grooves ST piercing through the insulating layer 43 to the insulating layer 42 to reach the sacrificial layer 55 are formed in the stacked body 15. As shown in FIG. 7B, the grooves ST extend in the X-axis direction and divide the stacked body 15. The sacrificial layer 55 is exposed on the bottom surfaces of the grooves ST.

Figure 8A:
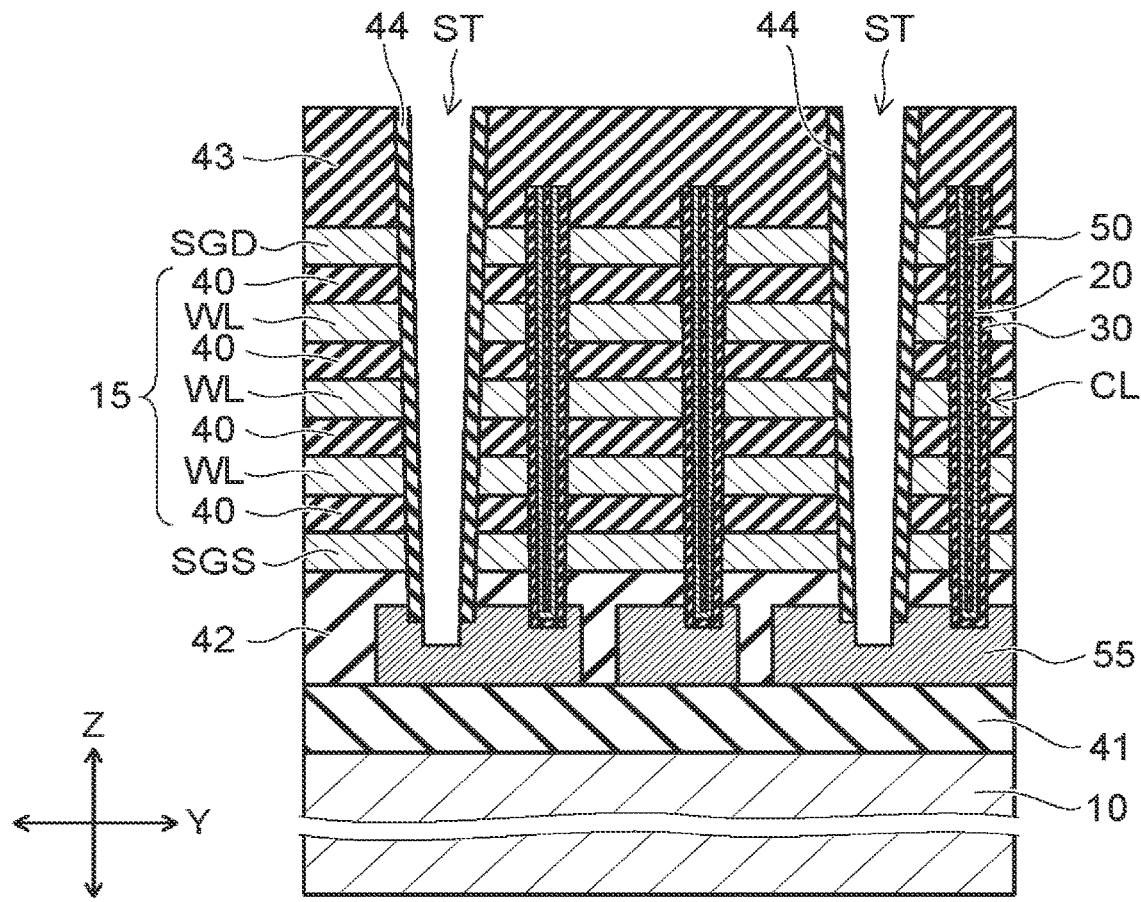
Figure 8B:
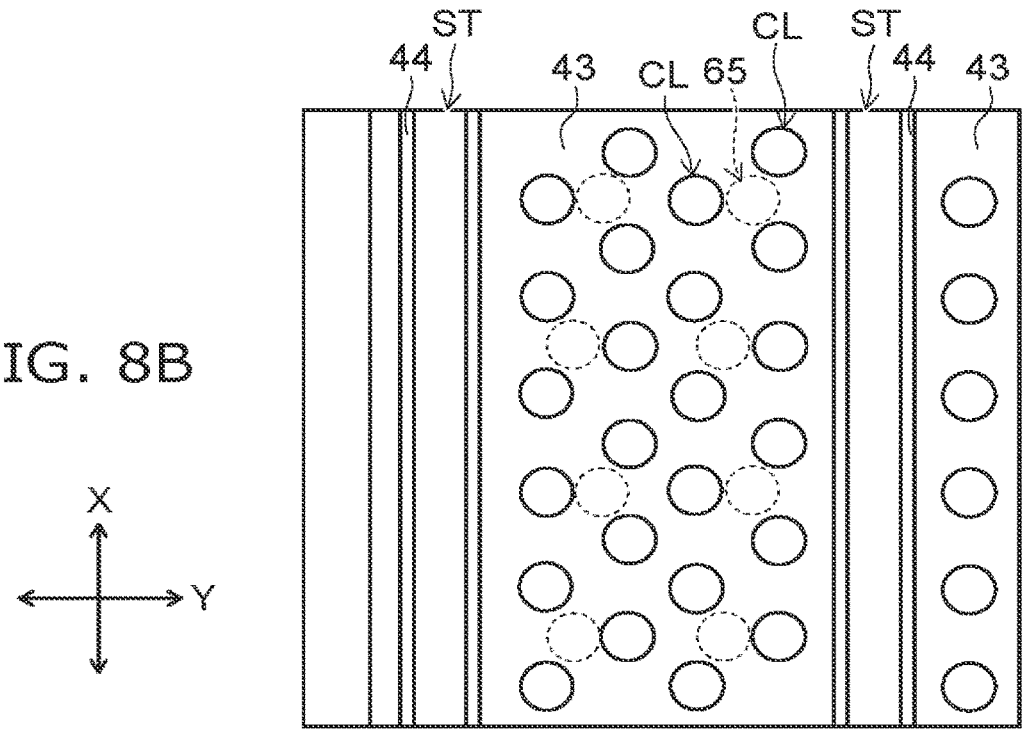

As shown in FIG. 8A, the insulating films 44 are formed on the sidewalls of the grooves ST. The insulating films 44 formed on the bottoms of the grooves ST are removed. Consequently, the side surfaces of the source side selection gate SGS, the stacked body 15, and the drain side selection gate SGD exposed on the sidewalls of the grooves ST are covered by the insulating layer 43.

Figure 9A:
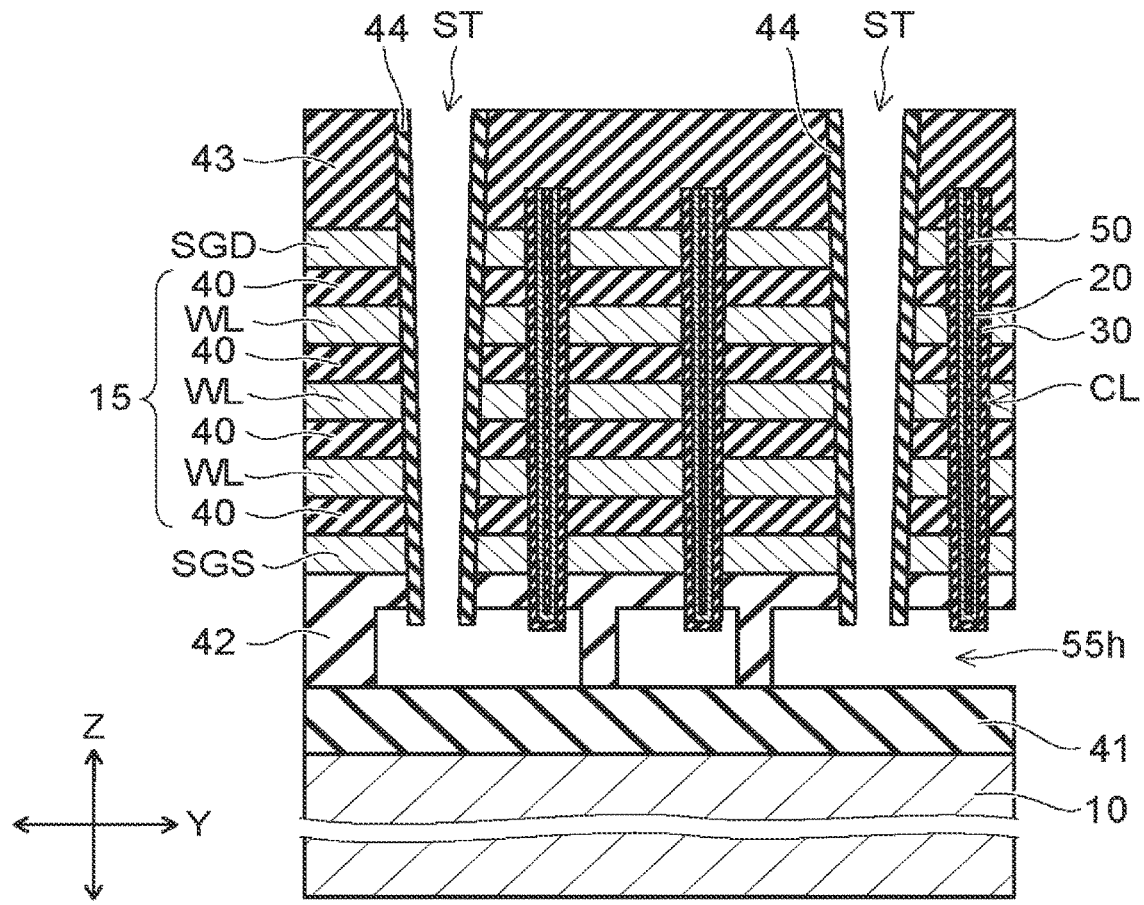
Figure 9B:
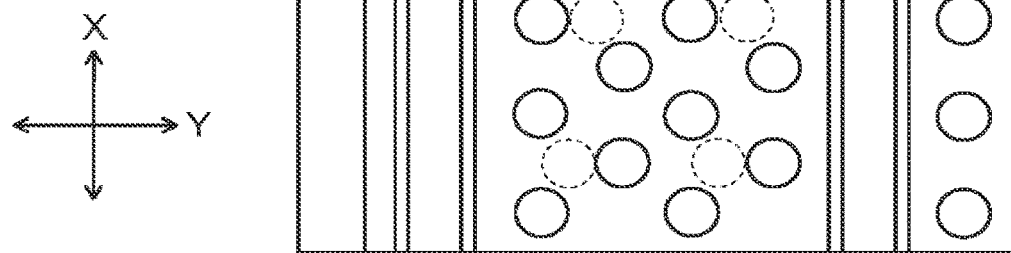

As shown in FIG. 9A, the sacrificial layer 55 is removed by, for example, wet etching through the grooves ST. Consequently, hollows 55h are formed under the stacked body 15.

The hollows 55h are connected to the grooves ST. The lower end portions 20u of the channel bodies 20 project to the hollows 55h and are covered by the memory films 30. The memory films 30 that cover the lower end portions 20u of the channel bodies 20 are exposed to the hollows 55h.

In this case, the stacked body 15 is supported by the columns 65 formed among the hollows 55h.

Figure 10A:
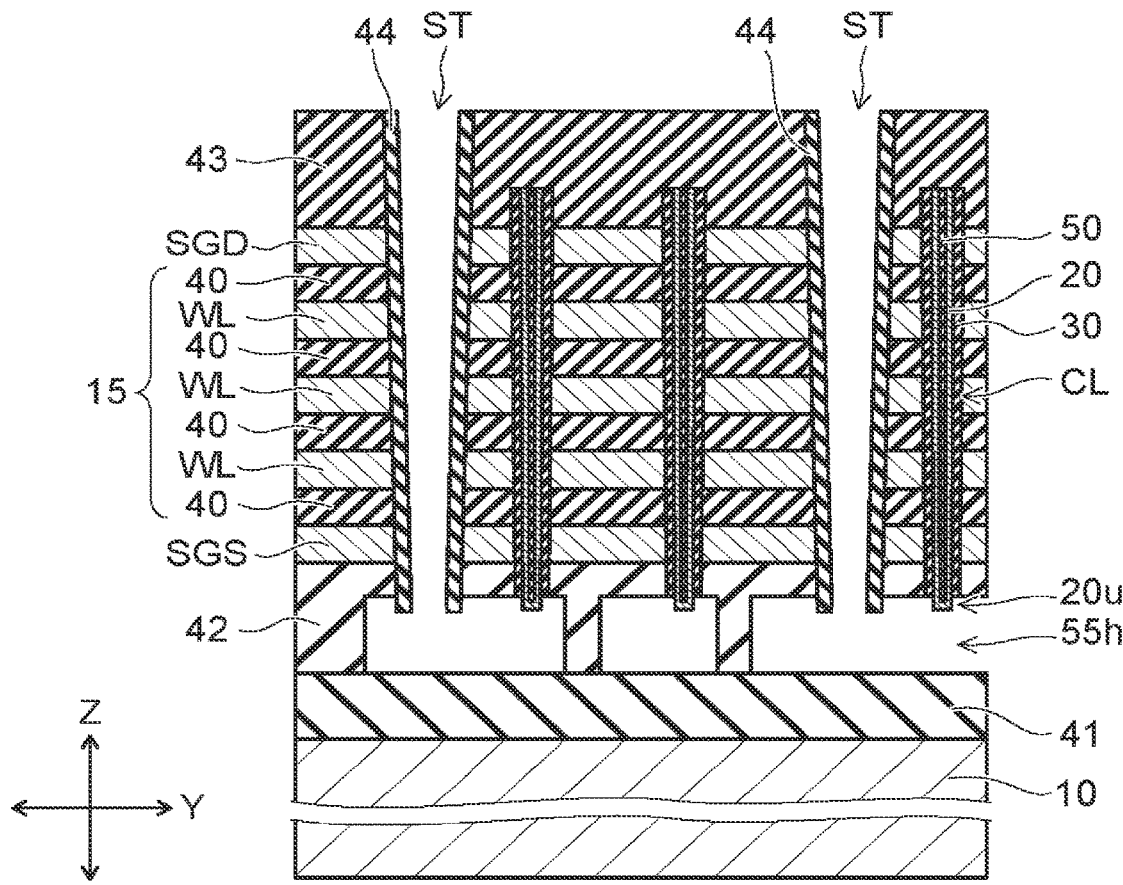
Figure 10B:
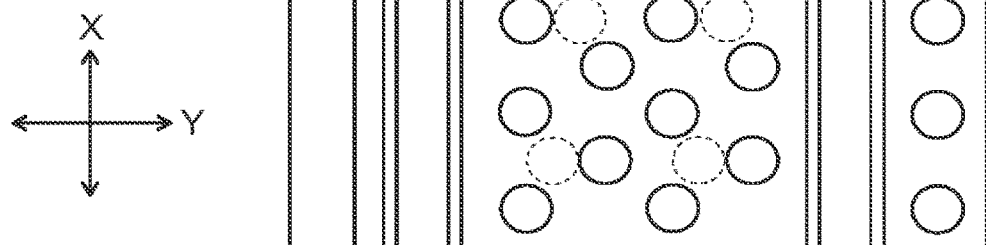

As shown in FIG. 10A, the memory films 30 exposed to the hollows 55h are removed by, for example, the wet etching through the grooves ST. Consequently, the lower end portions 20u of the channel bodies 20 projecting to the hollows 55h are exposed to the hollows 55h without being covered by the memory films 30.

Figure 11A:
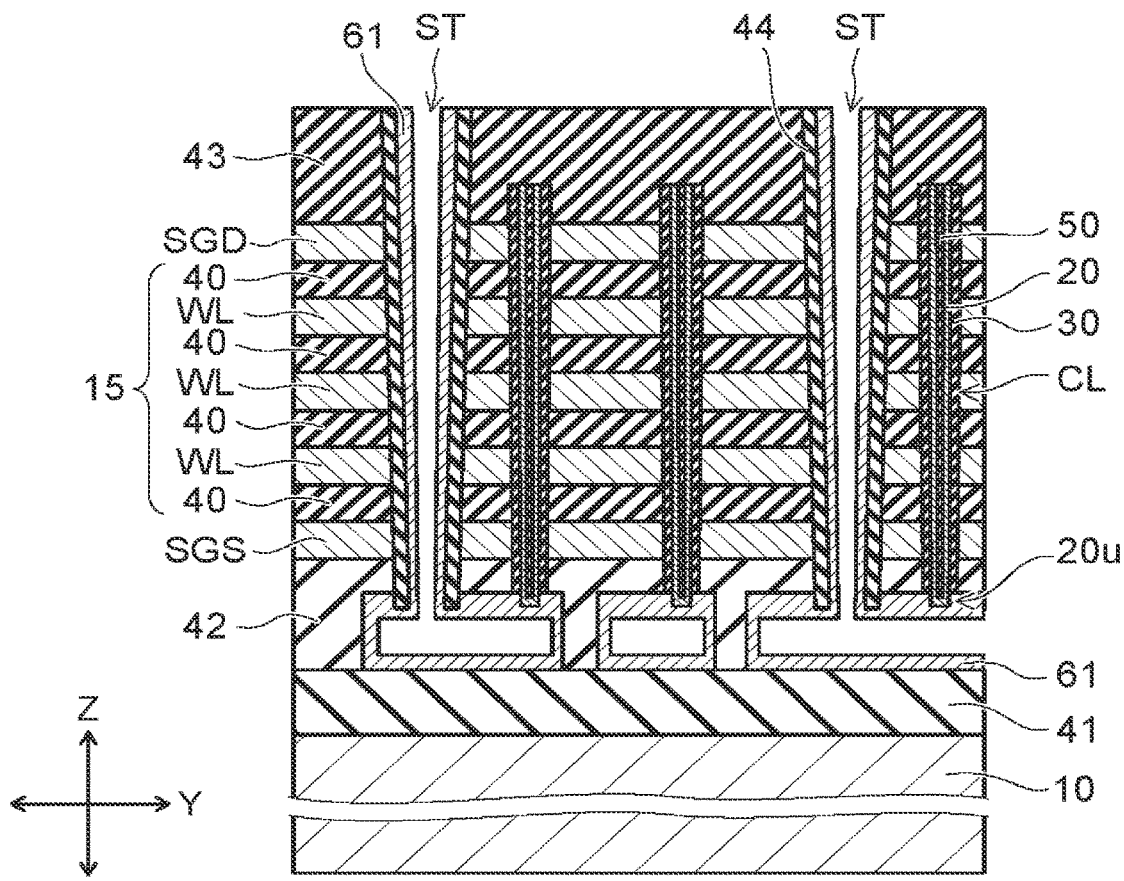
Figure 11B:
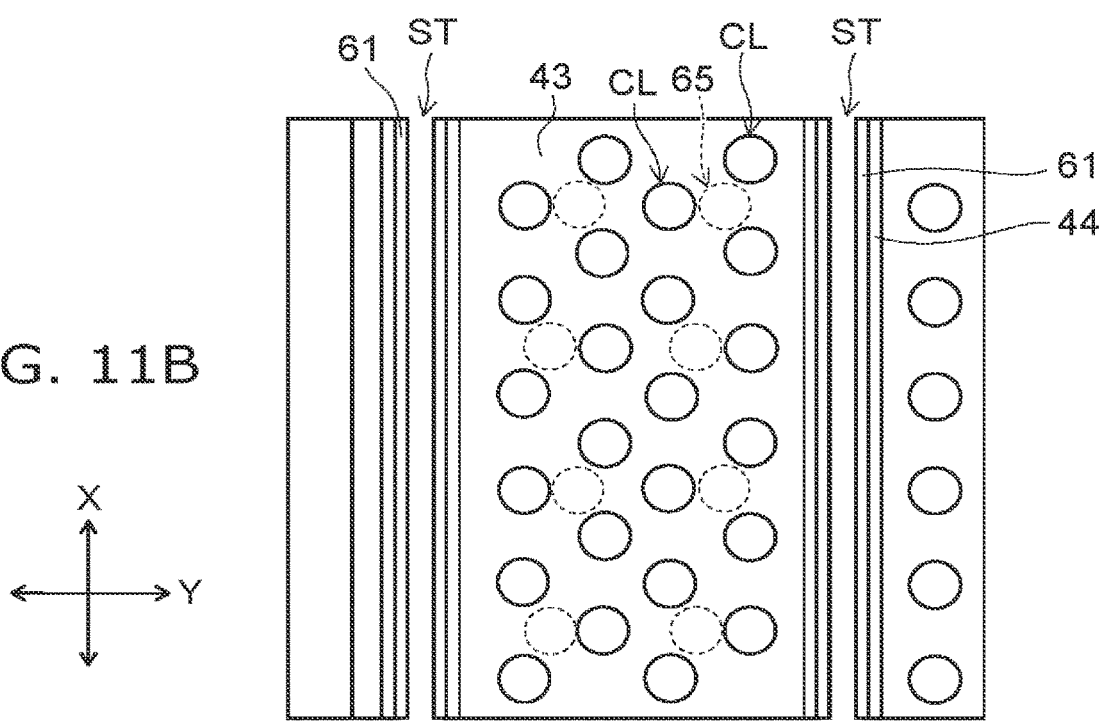

Thereafter, as shown in FIG. 11A, the first films 61 having electric conductivity are formed on the inner walls of the hollows 55h and the sidewalls of the grooves ST. The first films 61 are integrally formed on the inner walls of the hollows 55h and the sidewalls of the grooves ST. That is, the same first films 61 are formed on the sidewalls of the grooves ST and the inner walls of the hollows 55h.

The lower end portions 20u of the channel bodies 20 projecting to the hollows 55h are covered by the first films 61. The first films 61 are conformally formed along the end faces (bottom surfaces) and the side surfaces of the lower end portions 20u. As the first films 61, for example, polysilicon films are used.

Figure 12A:
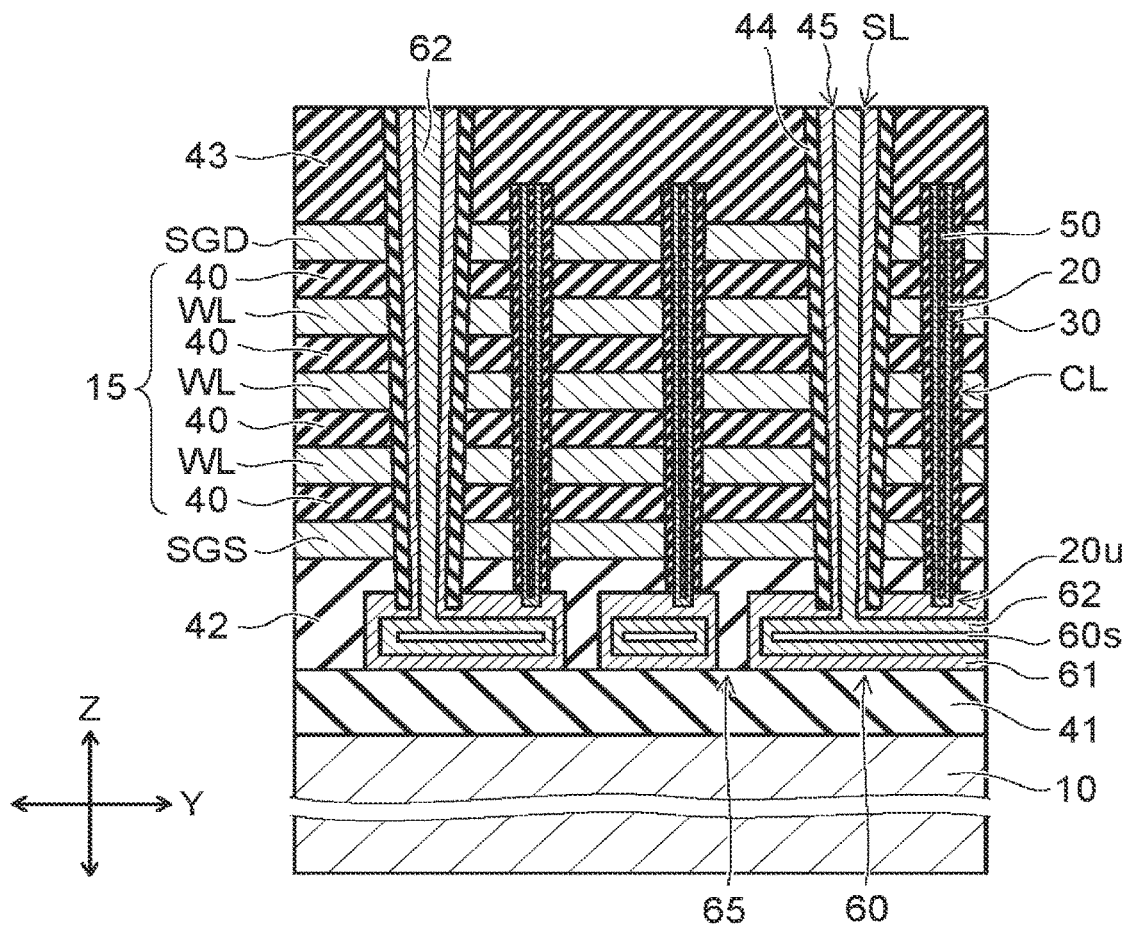
Figure 12B:
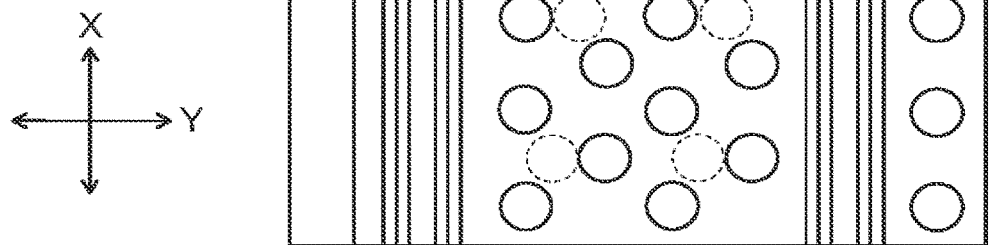

As shown in FIG. 12A, the second films 62 are formed in the hollows 55h and the grooves ST. The second films 62 cover the lower end portions 20u of the channel bodies 20 via the first films 61. Consequently, the conductive layers 60 and the source layers SL are formed.

In the conductive layers 60, the air gaps 60s are formed. The air gaps 60s are entirely covered by the second films 62. The air gaps 60s are not in contact with the lower end portions 20u of the channel bodies 20.

For example, as shown in FIG. 13A, the first barrier films 63 and the second barrier films 64 may be formed between the first films 61 and the second films 62.

The first barrier films 63 are formed between the first films 61 and the second films 62. The second barrier films 64 are formed between the first barrier films 63 and the second films 62.

As the first barrier films 63, for example, titanium films are used. As the second barrier films 64, for example, titanium nitride films are used.

As shown in FIG. 2A, the contact plugs CN piercing through the insulating layer 43 to reach the columnar sections CL are formed.

Thereafter, the bit lines BL, source interconnects, and the like are formed. Consequently, the semiconductor memory device in the embodiment is obtained.

According to the embodiment, the conductive layers 60 are formed by the replacing process using the sacrificial layer 55. Consequently, it is possible to etch only the memory films 30 formed on the bottom surfaces of the columnar sections CL. Therefore, the memory films 30 of the memory cells formed above the lower end portions 20u of the channel bodies 20 are not affected by the etching. Therefore, it is possible to suppress characteristic fluctuation and deterioration of the memory cells. Further, it is possible to realize a reduction in a block size and an increase in an electric current. It is possible to perform a high-speed operation.

Figure 14A:
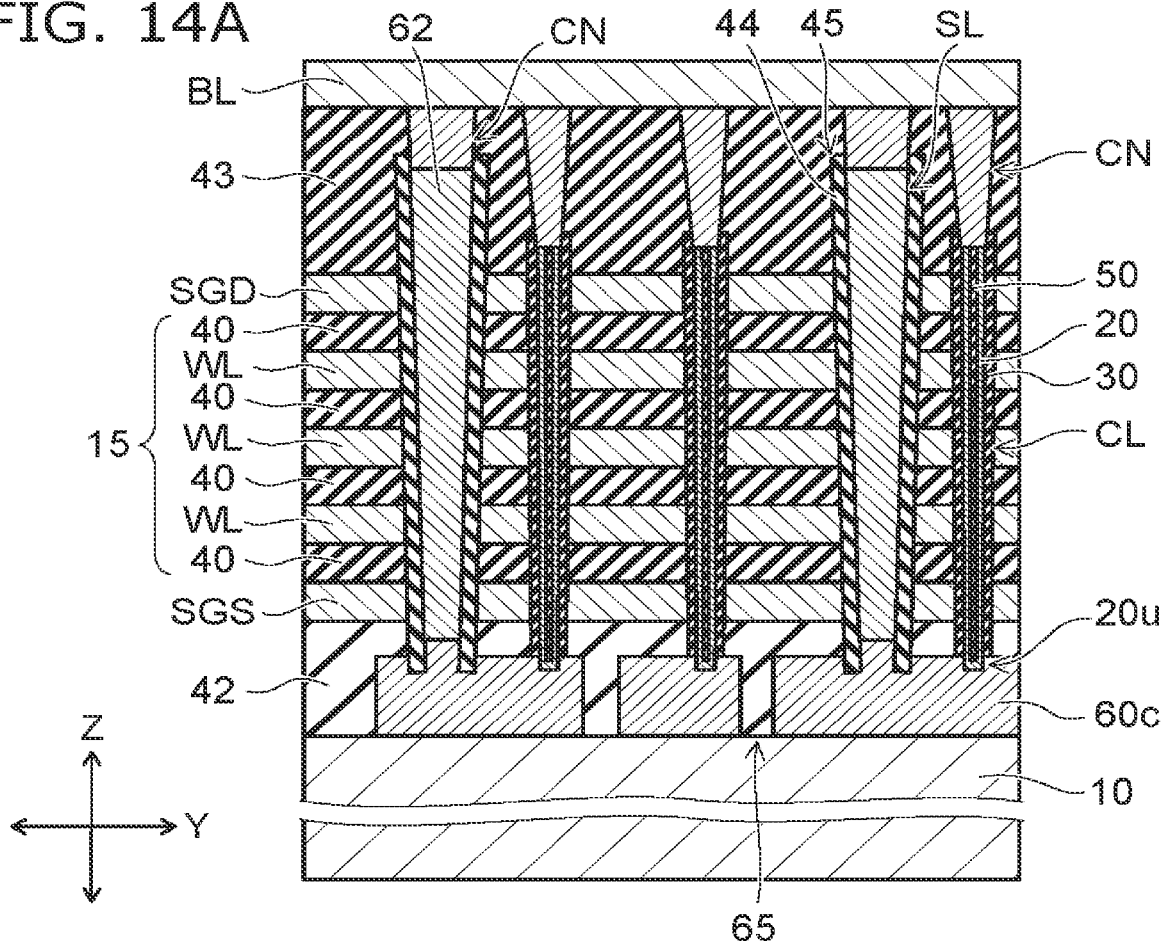
FIG. 14A is a schematic top view of the memory strings in another embodiment and FIG. 14B is a schematic.
Figure 14B:
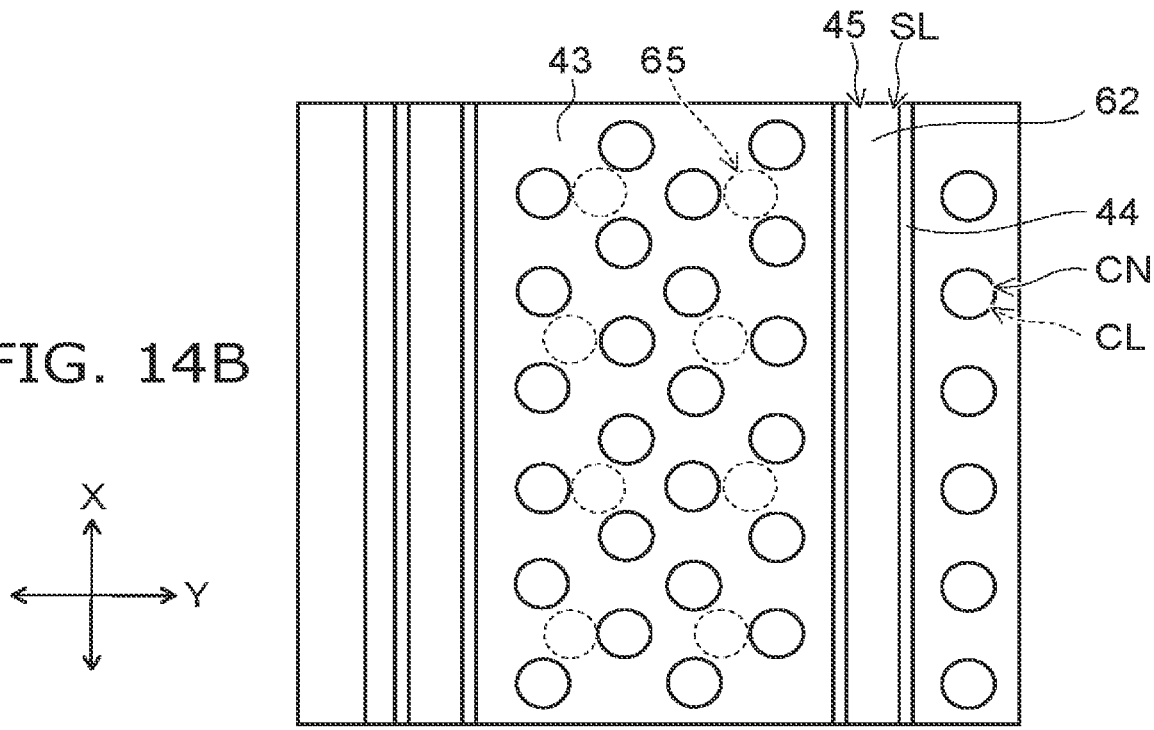

FIGS. 14A and 14B are schematic diagrams of a memory string in another embodiment. FIG. 14A is a schematic sectional view of the memory string MS. FIG. 14B shows an upper surface parallel to the XY plane in FIG. 14A.

According to the embodiment, as shown in FIG. 14A, the conductive layer 60 is provided on the substrate 10 not via the insulating layer 41. The conductive layer 60 includes crystal film 60c. The conductive layer 60 is provided in the insulating layer 42.

In the conductive layer 60, the crystal film 60c is embedded and air gap is not provided. The crystal film 60c is formed by an epitaxial growth method with, for example, silicon of the substrate 10 as cores.

The lower end portion 20u of the channel body 20 is covered with the crystal film 60c. The channel body 20 is electrically connected to the conductive layer 60 via the lower end portion 20u.

In the embodiment, as in the embodiment described above, the area of the channel body 20 in contact with the conductive layer 60 is large and contact resistance decreases.

The source layer SL in the groove ST includes the second film 62 (metal film). The second film 62 is embedded in the source layer SL. The second film 62 is in contact with the crystal film 60c of the conductive layer 60 and electrically connected to the crystal film 60c. Consequently, the channel body 20 is electrically connected to the source layer SL via the conductive layer 60.

The insulating film 44 is provided between the side surface of the source layer SL and the electrode layer WL of the stacked body 15. Consequently, the source layer SL is not short-circuited with the electrode layer WL. The insulating film 44 is also provided between the source side selection gate SGS and the source layer SL and between the drain side selection gate SGD and the source layer SL.

According to the embodiment, as in the embodiment described above, it is possible to realize reliability improvement and refining of the memory cells. Further, it is possible to realize a reduction in a block size and an increase in an electric current. It is possible to perform a high-speed operation.

A method for manufacturing the semiconductor memory device in the other embodiment is described with reference to FIGS. 15A and 15B.

Figure 15A:
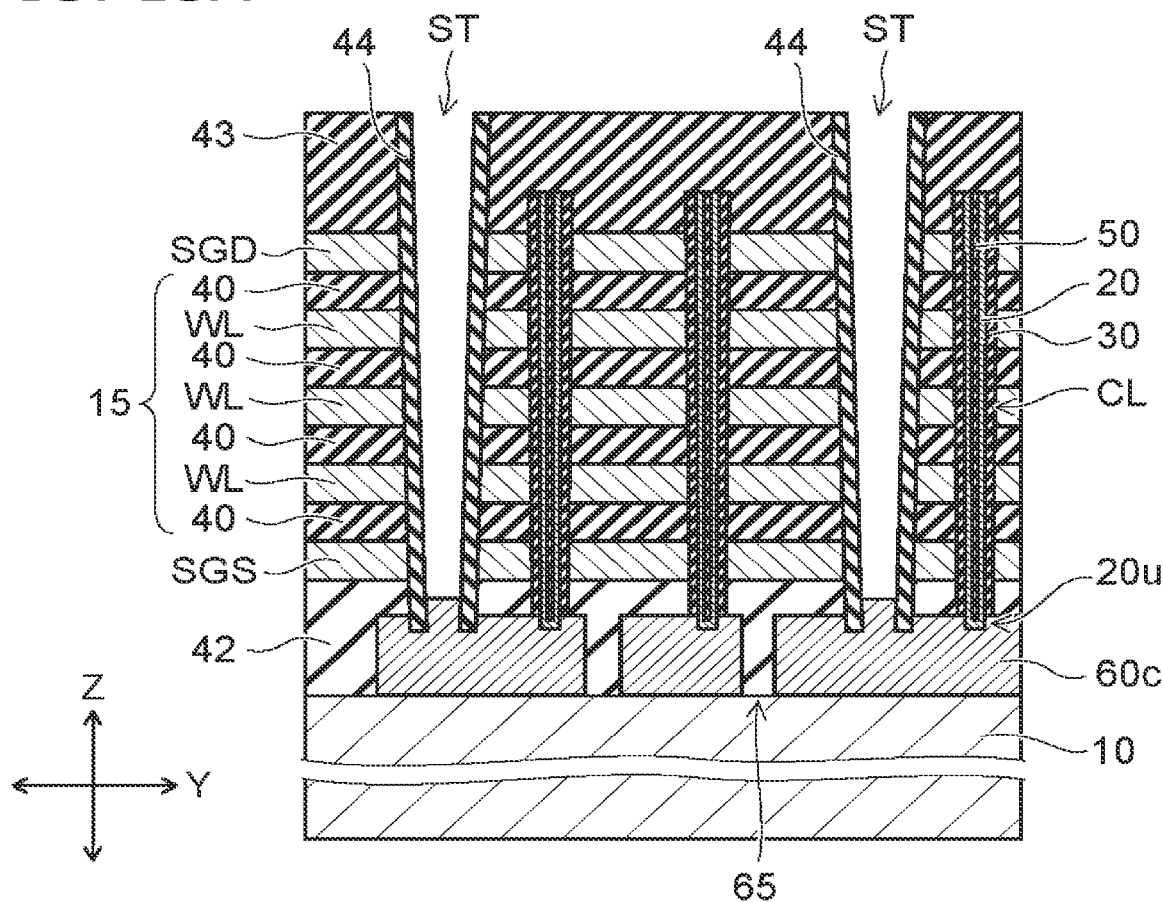
FIG. 15A and FIG. 15B are schematic views showing a method for manufacturing the semiconductor memory device of the another embodiment.
Figure 15B:
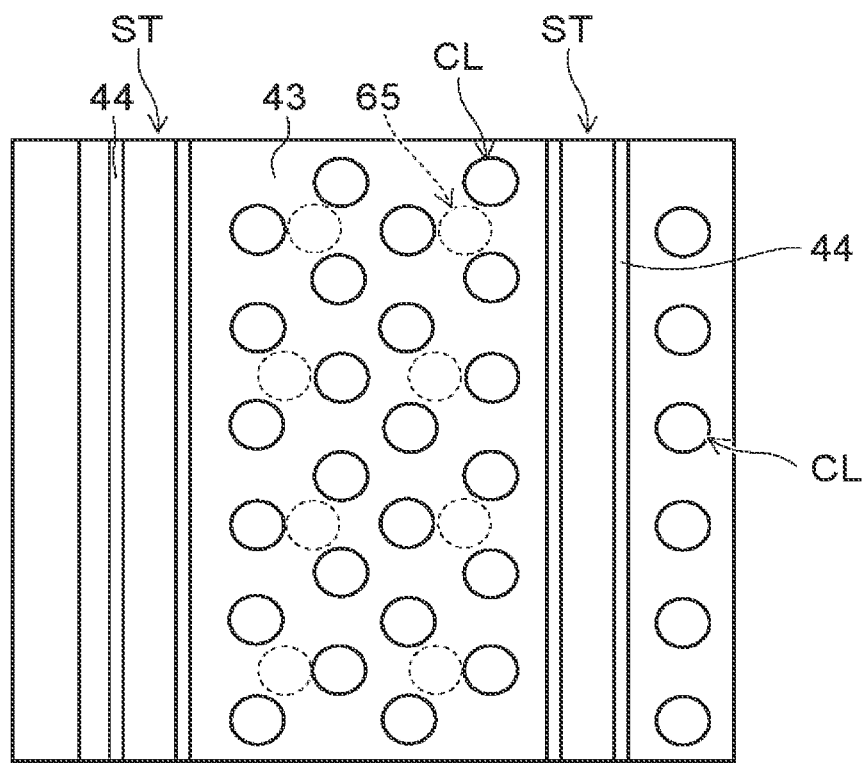

FIG. 15A is a schematic sectional view. FIG. 15B is a schematic top view in FIG. 15A. In the embodiment, unlike FIG. 4A in the embodiment described above, the sacrificial layer 55 is formed on the substrate 10 not via the insulating layer 41. The holes 65h are formed in the sacrificial layer 55. The holes 65h pierce through the sacrificial layer 55.

For example, the substrate 10 is formed in a recessed shape. The sacrificial layer 55 is embedded in recessed sections of the substrate 10. In this case, the holes 65h are not formed in the sacrificial layer 55. The outer sides of the recessed sections of the substrate 10 are formed as the columns 65.

Thereafter, a manufacturing method same as the manufacturing method shown in FIGS. 5A to 10B in the embodiment described above is used. Therefore, explanation of the manufacturing method is omitted.

Insulating films are embedded in the holes 65h. Consequently, the columns 65 are formed. The sacrificial layer 55 is surrounded and covered by the insulating layer 42. Thereafter, the source side selection gate SGS is formed on the sacrificial layer 55 and the columns 65 via the insulating layer 42. The stacked body 15 in which the interlayer insulating layers 40 and the electrode layers WL are alternately stacked is formed on the source side selection gate SGS. The drain side selection gate SGD is formed on the top electrode layer WL via the interlayer insulating layer 40. The insulating layer 43 is formed on the drain side selection gate SGD.

Thereafter, the plurality of memory holes MH are formed in the stacked body. The memory holes MH are formed by, for example, the RIE method using a not-shown mask. The memory holes MH pierce through the insulating layer 43 to the insulating layer 42 to reach the sacrificial layer 55.

After the memory holes MH are formed, the films (the memory films 30 and the films including the channel bodies 20) shown in FIG. 3 are formed in order on the inner walls (the side walls and the bottoms) of the memory holes MH. Thereafter, the films formed on the insulating layer 42 are removed. Consequently, the columnar sections CL are formed.

In this case, the lower end portions 20u of the channel bodies 20 project to the sacrificial layer 55 and are covered by the memory films 30. The memory films 30 that cover the lower end portions 20u of the channel bodies 20 are covered by the sacrificial layer 55.

Subsequently, the grooves ST piercing through the insulating layer 43 to the insulating layer 42 to reach the sacrificial layer 55 are formed in the stacked body 15. The grooves ST extend in the X-axis direction and divide the stacked body 15. The sacrificial layer 55 is exposed on the bottom surfaces of the grooves ST.

Thereafter, the insulating films 44 are formed on the sidewalls of the grooves ST. The insulating films 44 formed on the bottoms of the grooves ST are removed. Consequently, the side surfaces of the source side selection gate SGS, the stacked body 15, and the drain side selection gate SGD exposed on the sidewalls of the grooves ST are covered by the insulating layer 43.

Subsequently, the sacrificial layer 55 is removed by, for example, the wet etching through the grooves ST. Consequently, the hollows 55h are formed under the stacked body 15.

The hollows 55h are connected to the grooves ST. The lower end portions 20u of the channel bodies 20 project to the hollows 55h and are covered by the memory films 30. The memory films 30 that cover the lower end portions 20u of the channel bodies 20 are exposed to the hollows 55h.

In this case, the stacked body 15 is supported by the columns 65 formed among the hollows 55h.

Subsequently, the memory films 30 exposed to the hollows 55h are removed by, for example, the wet etching through the grooves ST. Consequently, the lower end portions 20u of the channel bodies 20 projecting to the hollows 55h are exposed to the hollows 55h without being covered by the memory films 30.

Thereafter, as shown in FIG. 15A, the crystal films 60c are embedded in the inner walls of the hollows 55h. The crystal films 60c are formed by the epitaxial growth method with, for example, the silicon on the upper surface of the substrate 10 as cores. As the crystal films 60c, for example, semiconductor crystal films (silicon films, silicon germanium films, etc.) are used.

The crystal films 60c cover the lower end portions 20u of the channel bodies 20 projecting to the hollows 55h. The lower end portions 20u of the channel bodies 20 are electrically connected to the crystal films 60c. Consequently, the conductive layers 60 are formed.

Thereafter, as shown in FIG. 14A, the second films 62 are formed in the grooves ST. The second films 62 are formed on the inner sides of the insulating films 44 and embed source layers. The bottom surfaces of the second films 62 are in contact with the crystal films 60c and electrically connected to the crystal films 60c. Consequently, the source layers SL are formed.

The source layers SL are electrically connected to the channel bodies 20 via the conductive layers 60. The source layers SL are made of, for example, a material different from the material of the crystal films 60c. Subsequently, the contact plugs CN piercing through the insulating layer 43 to reach the columnar sections CL are formed.

Thereafter, the bit lines BL, source interconnects, and the like are formed. Consequently, the semiconductor memory device in the embodiment is obtained.

According to the embodiment, as in the embodiment described above, the memory films 30 of the memory cells formed above the lower end portions 20u of the channel bodies 20 are not affected by the etching. Therefore, it is possible to suppress characteristic fluctuation and deterioration of the memory cells. Further, it is possible to realize a reduction in a block size and an increase in an electric current. It is possible to perform a high-speed operation.

Figure 16A:
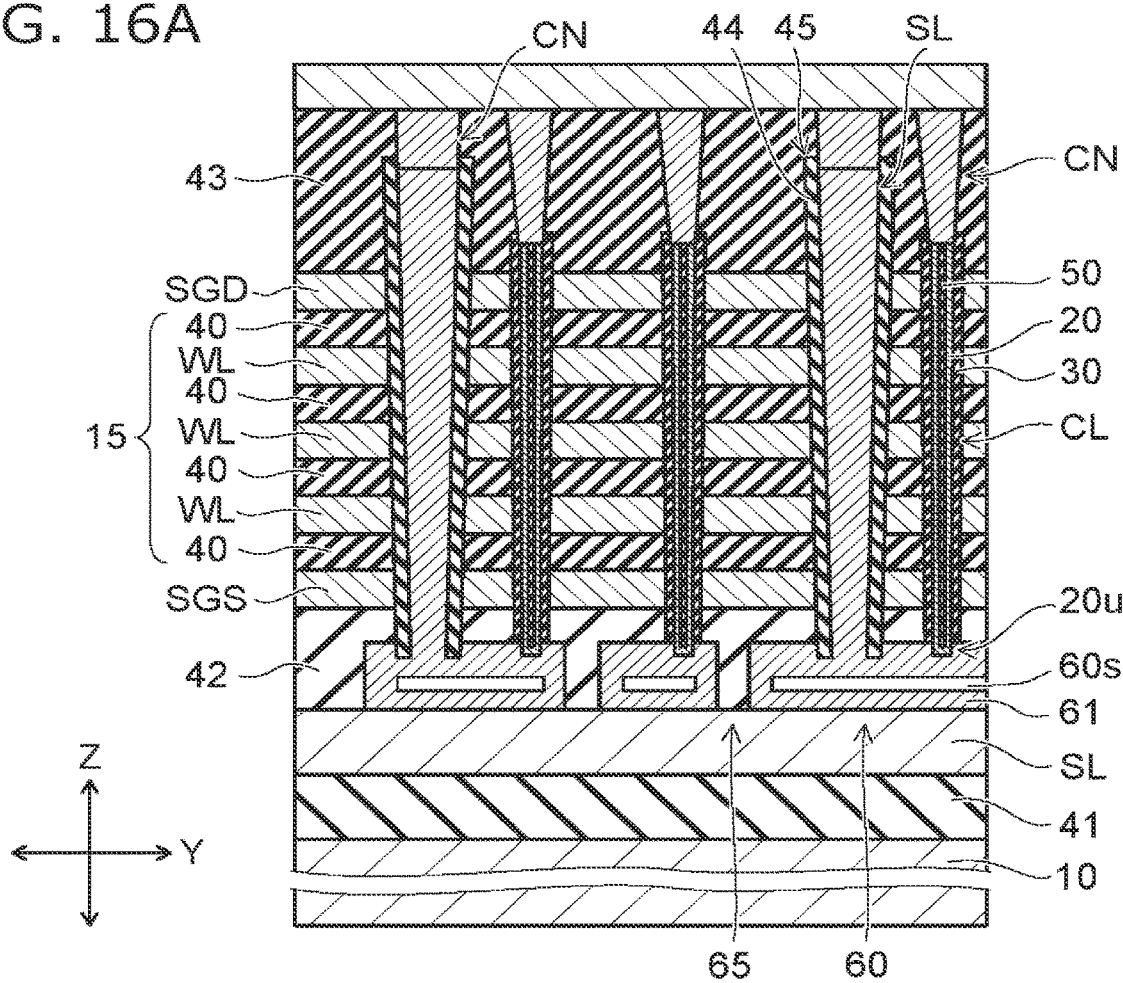
FIG. 16A is schematic top view of the memory strings in still another embodiment and FIG. 16B is schematic sectional view of the memory strings in the still another embodiment.
Figure 16B:
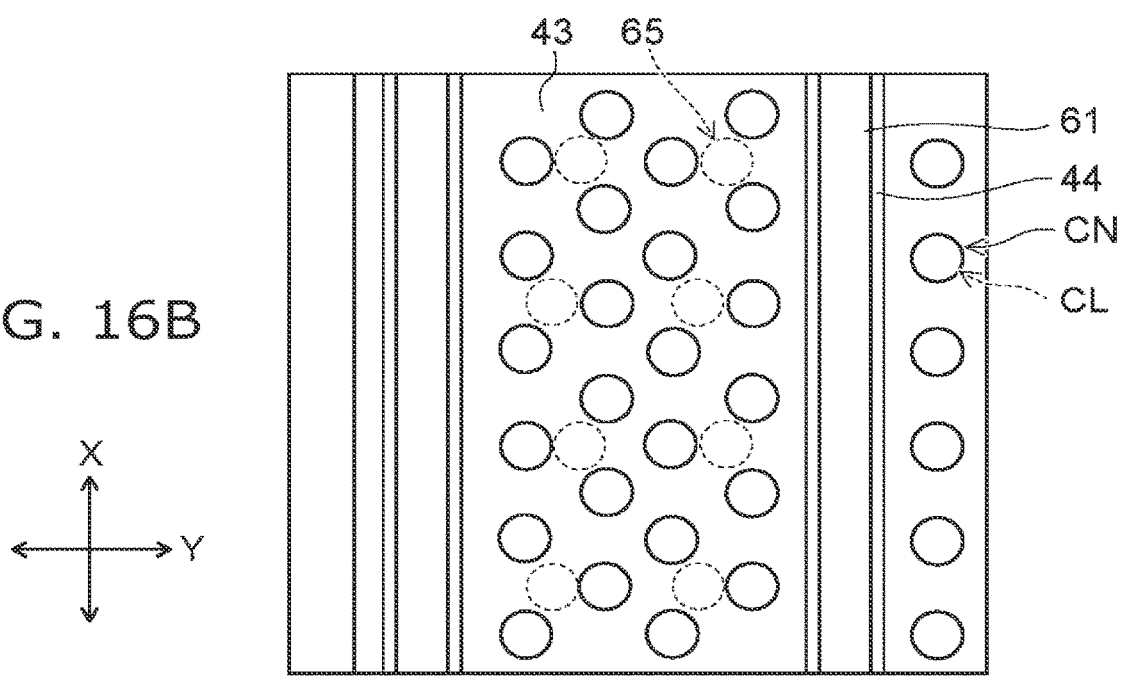
Figure 17A:
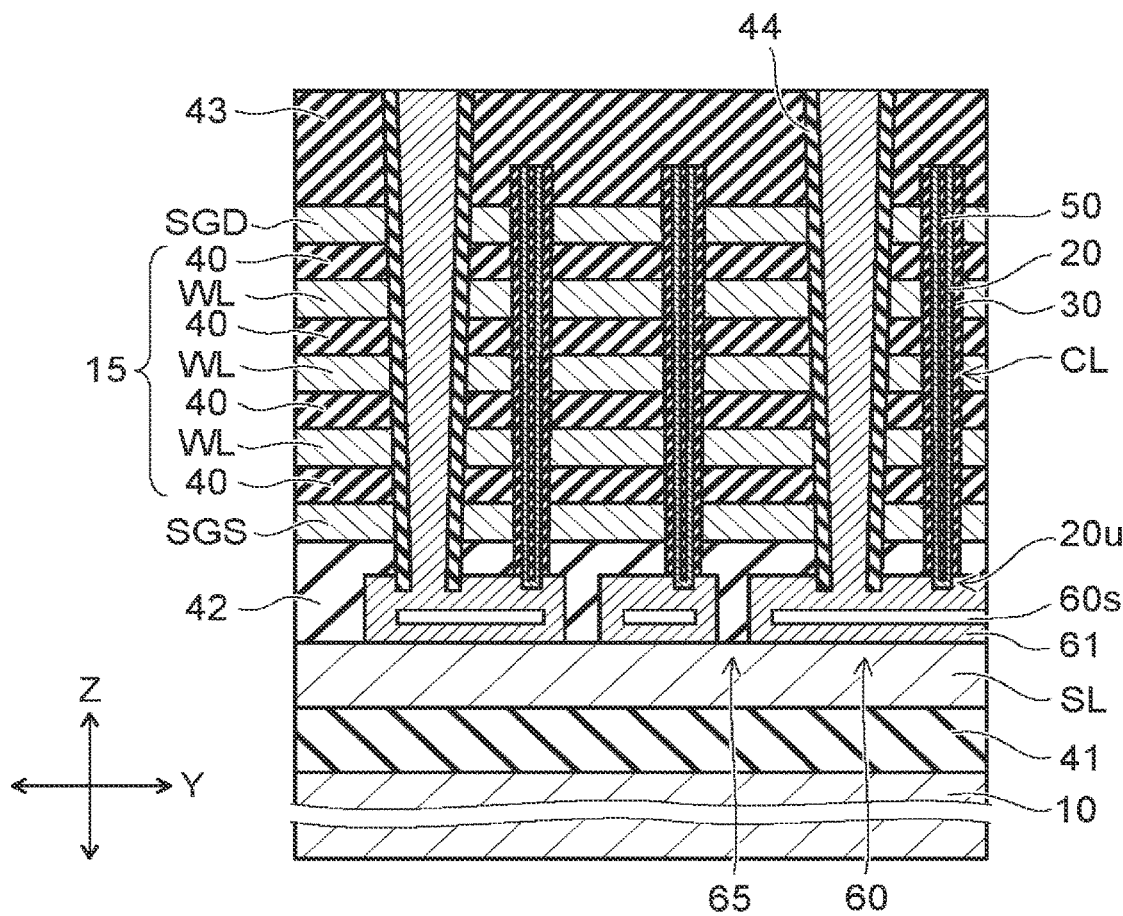
FIG. 17A and FIG. 17B are schematic views showing a method for manufacturing the semiconductor memory device of the still another embodiment.
Figure 17B:
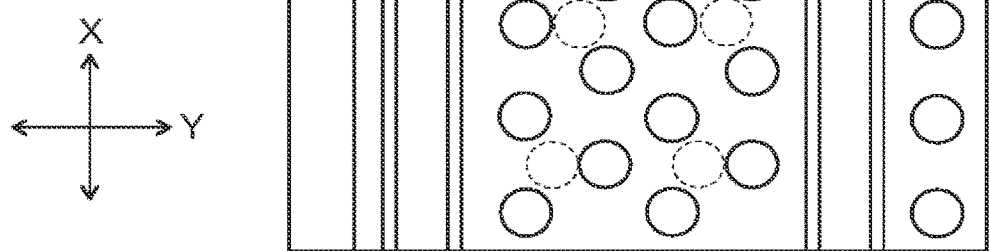

FIGS. 16A and 16B are schematic diagrams of a memory string in still another embodiment. FIG. 16A is a schematic sectional view of the memory string MS. FIG. 16B shows an upper surface parallel to the XY plane in FIG. 16A.

According to the embodiment, as shown in FIG. 16A, the source layer SL (a metal layer) is provided on the substrate 10 via the insulating layer 41 (first insulating layer). The conductive layer 60 and insulating layer 42 (second insulating layer) are provided on the source layer SL. The conductive layer 60 is provided in the insulating layer 42. The conductive layer 60 includes the first film 61 and the air gap 60s.

The first film 61 is provided on the side surface side of the conductive layer 60. The air gap 60s is provided on the inner side of the first film 61 and is entirely surrounded and covered by the first film 61.

The lower end portion 20u of the channel body 20 is covered by the first film 61. The channel body 20 is electrically connected to the conductive layer 60 via the lower end portion 20u. Consequently, the channel body 20 is electrically connected to the source layer SL via the conductive layer 60.

In the embodiment, as in the embodiment described above, the area of the channel body 20 in contact with the conductive layer 60 is large and contact resistance decreases.

The first film 61 is embedded in dividing section ST. The first film 61 is integrally provided from the conductive layer 60 to the dividing section ST. For example, insulating film may be embedded in the dividing section ST.

The insulating film 44 is provided between the side surface of the first film 61 of the dividing section ST and the electrode layer WL of the stacked body 15. Consequently, the first film 61 is not short-circuited with the electrode layer WL. The insulating film 44 is also provided between the source side selection gate SGS and the source layer SL and between the drain side selection gate SGD and the source layer SL.

According to the embodiment, as in the embodiment described above, it is possible to realize reliability improvement and refining of the memory cells. Further, it is possible to realize a reduction in a block size and an increase in an electric current. It is possible to perform a high-speed operation.

Further, the source layer SL is provided under the conductive layer 60. Consequently, since it is unnecessary to provide the source layer SL in the dividing section ST, it is possible to reduce the size of the memory cell array 1.

A method for manufacturing the semiconductor memory device according to still another embodiment is described.

In the embodiment, unlike FIG. 4A in the embodiment described above, the source layer SL is formed on the substrate 10 via the insulating layer 41. As the source layer SL, for example, tungsten is used.

The sacrificial layer 55 is formed on the source layer SL. The holes 65h are formed in the sacrificial layer 55. The holes 65h pierce through the sacrificial layer 55.

Thereafter, a manufacturing method same as the manufacturing method shown in FIGS. 5A to 11B in the embodiment described above is used. Therefore, explanation of the manufacturing method is omitted.

Insulating films are embedded in the holes 65h. Consequently, the columns 65 are formed. The sacrificial layer 55 is surrounded and covered by the insulating layer 42. Thereafter, the source side selection gate SGS is formed on the sacrificial layer 55 and the columns 65 via the insulating layer 42. The stacked body 15 in which the interlayer insulating layers 40 and the electrode layers WL are alternately stacked is formed on the source side selection gate SGS. The drain side selection gate SGD is formed on the top electrode layer WL via the interlayer insulating layer 40. The insulating layer 43 is formed on the drain side selection gate SGD.

Thereafter, the plurality of memory holes MH are formed in the stacked body. The memory holes MH are formed by, for example, the RIE method using a not-shown mask. The memory holes MH pierce through the insulating layer 43 to the insulating layer 42 to reach the sacrificial layer 55.

After the memory holes MH are formed, the films (the memory films 30 and the films including the channel bodies 20) shown in FIG. 3 are formed in order on the inner walls (the side walls and the bottoms) of the memory holes MH. Thereafter, the films formed on the insulating layer 42 are removed. Consequently, the columnar sections CL are formed.

In this case, the lower end portions 20u of the channel bodies 20 project to the sacrificial layer 55 and are covered by the memory films 30. The memory films 30 that cover the lower end portions 20u of the channel bodies 20 are covered by the sacrificial layer 55.

Subsequently, the dividing sections ST piercing through the insulating layer 43 to the insulating layer 42 to reach the sacrificial layer 55 are formed in the stacked body 15. The dividing sections ST extend in the X-axis direction and divide the stacked body 15. The sacrificial layer 55 is exposed on the bottom surfaces of the dividing sections ST.

Thereafter, the insulating films 44 are formed on the sidewalls of the dividing sections ST. The insulating films 44 formed on the bottoms of the dividing sections ST are removed. Consequently, the side surfaces of the source side selection gate SGS, the stacked body 15, and the drain side selection gate SGD exposed on the sidewalls of the dividing sections ST are covered by the insulating layer 43.

Subsequently, the sacrificial layer 55 is removed by, for example, the wet etching through the dividing sections ST. Consequently, the hollows 55h are formed under the stacked body 15.

The hollows 55h are connected to the dividing sections ST. The lower end portions 20u of the channel bodies 20 project to the hollows 55h and are covered by the memory films 30. The memory films 30 that cover the lower end portions 20u of the channel bodies 20 are exposed to the hollows 55h.

In this case, the stacked body 15 is supported by the columns 65 formed among the hollows 55h.

Subsequently, the memory films 30 exposed to the hollows 55h are removed by, for example, the wet etching through the dividing sections ST. Consequently, the lower end portions 20u of the channel bodies 20 projecting to the hollows 55h are exposed to the hollows 55h without being covered by the memory films 30.

Thereafter, as shown in FIG. 16A, the first films 61 having electric conductivity are formed on the inner walls of the hollows 55h and the sidewalls of the dividing sections ST. the first films 61 are integrally formed on the inner walls of the hollows 55h and the sidewalls of the dividing sections ST. That is, the same first films 61 are formed on the sidewalls of the dividing sections ST and the inner walls of the hollows 55h. The first films 61 are embedded in the inner walls of the dividing sections ST.

The lower end portions 20u of the channel bodies 20 projecting to the hollows 55h are covered by the first films 61. The air gaps 60s are formed on the inner sides of the first films 61. The air gaps 60s are entirely surrounded and covered by the first films 61. The source layer SL is electrically connected to the channel bodies 20 via the conductive layers 60.

Subsequently, the contact plugs CN piercing through the insulating layer 43 to reach the columnar sections CL are formed. Thereafter, the bit lines BL, source interconnects, and the like are formed. Consequently, the semiconductor memory device in the embodiment is obtained.

According to the embodiment, as in the embodiment described above, the memory films 30 of the memory cells formed above the lower end portions 20u of the channel bodies 20 are not affected by the etching. Therefore, it is possible to suppress characteristic fluctuation and deterioration of the memory cells. Further, it is possible to realize a reduction in a block size and an increase in an electric current. It is possible to perform a high-speed operation.

Figure 18:
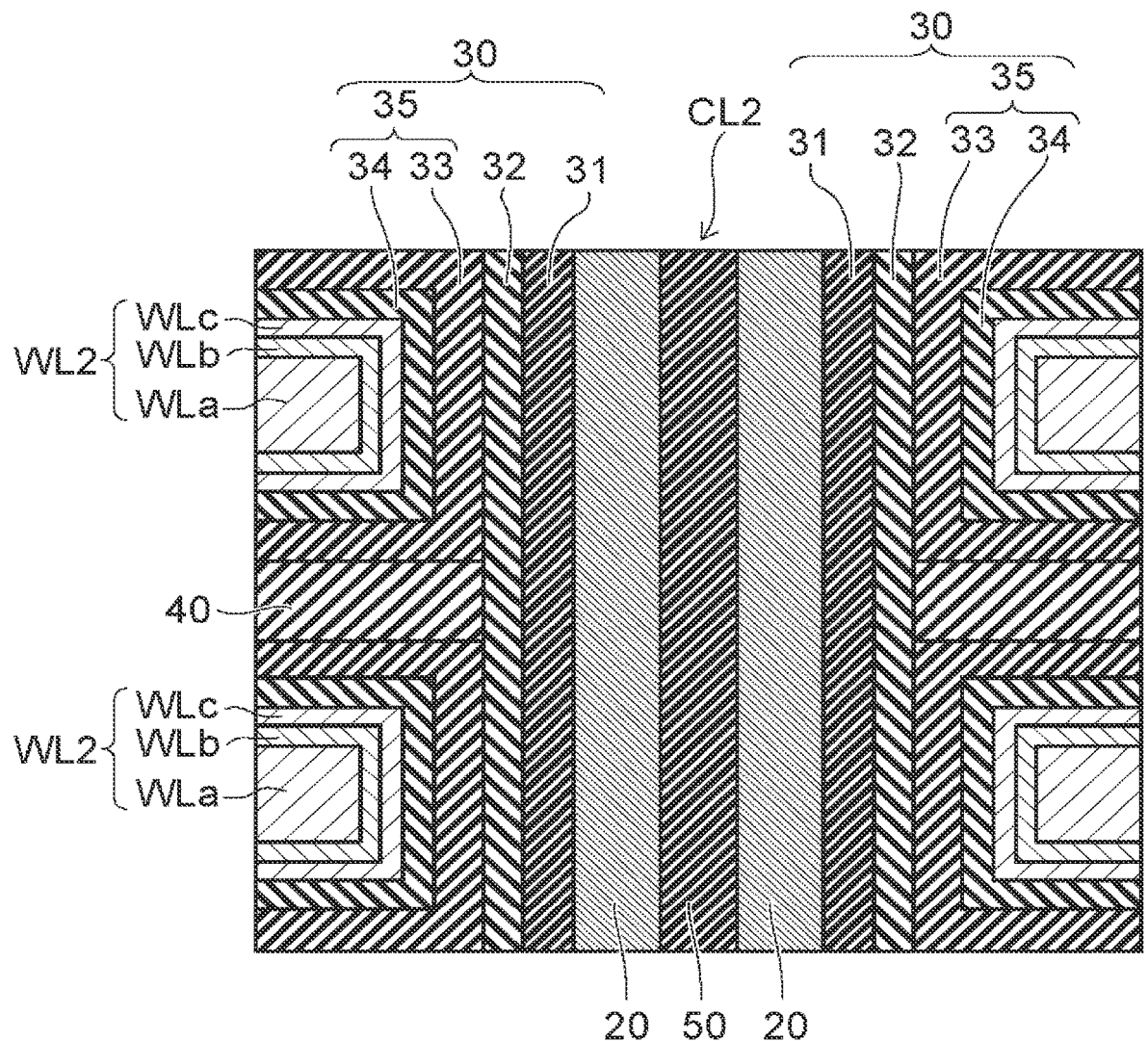
FIG. 18 is an enlarged schematic sectional view of a part of a columnar section in another memory cell array in the embodiment.

FIG. 18 is an enlarged schematic sectional view of a part of a columnar section in another memory cell array in the embodiment.

A memory cell array 2 includes electrode layers WL2 and a columnar section CL2 different from those of the memory cell array 1 described above. The memory cell array 2 is the same as the memory cell array 1 except the electrode layers WL2 and the columnar section CL2. Therefore, explanation of the same components is omitted.

As shown in FIG. 18, the electrode layers WL2 include first metal layers WLa, second metal layers WLb, and cover layers WLc. As the first metal layer WLa and the second metal layer WLb, for example, tungsten is used. As the cover layer WLc, for example, titanium nitride is used.

The columnar section CL2 is formed in a memory hole formed in the stacked body 15 including a plurality of the electrode layers WL2 and a plurality of the interlayer insulating layers 40. In the memory hole, the channel bodies 20 functioning as semiconductor channels are provided. The channel bodies 20 are, for example, silicon films including silicon as a main component.

The memory films 30 are provided between the electrode layers WL2 and the channel bodies 20. The memory films 30 include the block insulating films 35, the charge storage films 32, and the tunnel insulating films 31.

The block insulating films 35, the charge storage films 32, and the tunnel insulating films 31 are provided in order from the electrode layer WL2 sides between the electrode layers WL2 and the channel bodies 20. The block insulating films 35 cover the electrode layers WL2. The tunnel insulating films 31 are in contact with the channel bodies 20. The charge storage films 32 are provided between the block insulating films 35 and the tunnel insulating films 31.

The electrode layers WL2 surround the channel bodies 20 via the memory films 30. The core insulating film 50 is provided on the inner sides of the channel bodies 20.

The tunnel insulating films 31 are, for example, silicon oxide films. Alternatively, as the tunnel insulating films 31, laminated films (ONO films) formed by sandwiching a silicon nitride film with a pair of silicon oxide films may be used.

The block insulating films 35 include the cap films 34 that surround and cover the electrode layers WL2 and the block films 33 that cover the electrode layers WL2 via the cap films 34. The block films 33 are, for example, silicon oxide films. The cap films 34 are films having a dielectric constant higher than the dielectric constant of the block film 33 and are, for example, at least one of aluminum oxide and silicon nitride films. By providing the cap films 34 in contact with the electrode layers WL2, it is possible to suppress back tunneling electrons injected from the electrode layers WL2 during erasing.

In the stacking direction, the block insulating films 35 are separated via the interlayer insulating layers 40.

In the memory cell array 2, as in the embodiment described above, it is possible to realize reliability improvement and refining of the memory cells. Further, it is possible to realize a reduction in a block size and an increase in an electric current. It is possible to perform a high-speed operation.

A method for manufacturing the other memory cell array in the embodiment is described with reference to FIGS. 19 to 23.

FIGS. 19 to 23 are schematic sectional views of the memory string MS.

Figure 19:
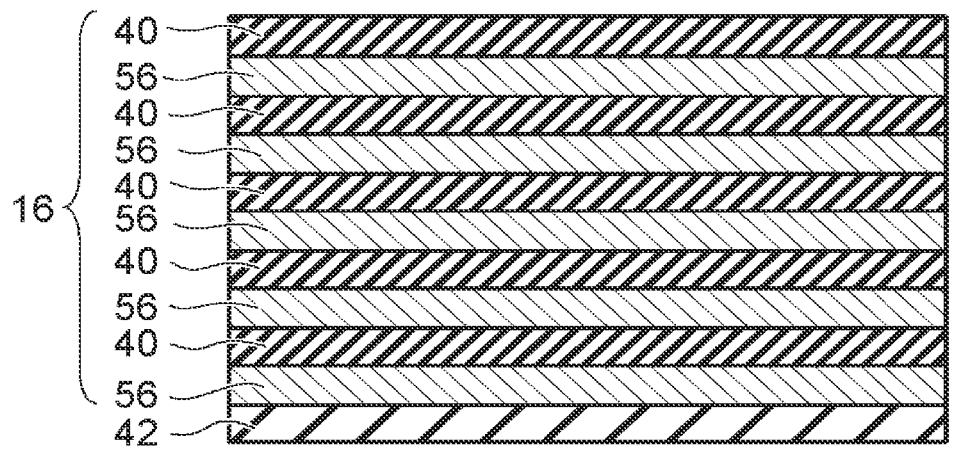
FIG. 19 to FIG. 23 are schematic sectional views showing a method for manufacturing the other memory cell array in the embodiment.

As shown in FIG. 19, sacrificial layers 56 and the interlayer insulating layers 40 are alternately stacked on the insulating layer 42. Note that structure below the insulating layer 42 is common to the structure in at least any one of the manufacturing methods described above. Therefore, explanation of the structure is omitted.

Figure 20:
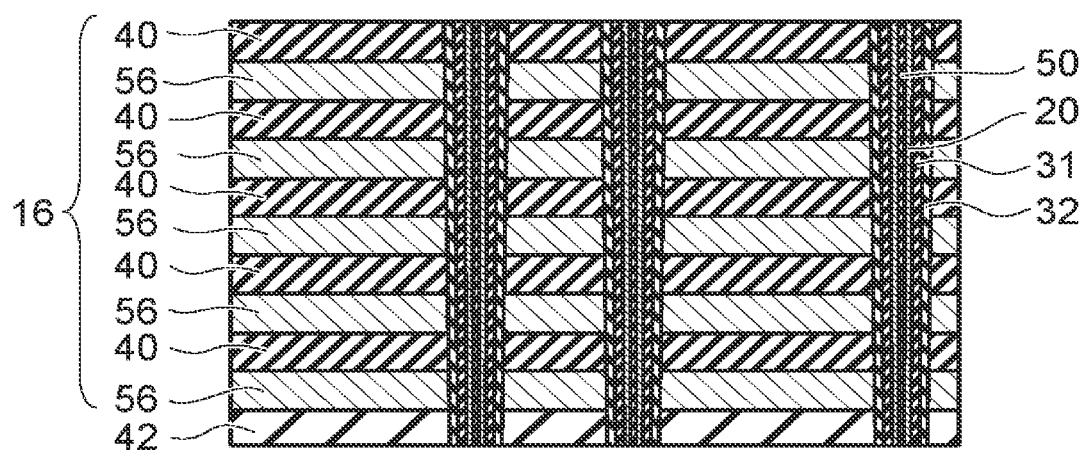

As shown in FIG. 20, the columnar sections CL2 piercing through a stacked body 16 in the stacking direction are formed. As shown in FIG. 18, in the columnar section CL2, the charge storage films 32, the tunnel insulating films 31, the channel bodies 20, and the core insulating film 50 are formed in order from the outer side. In the columnar section CL2, for example, like the columnar section CL described above, the block insulating films 35 may be formed on the side surfaces of the charge storage films 32.

Figure 21:
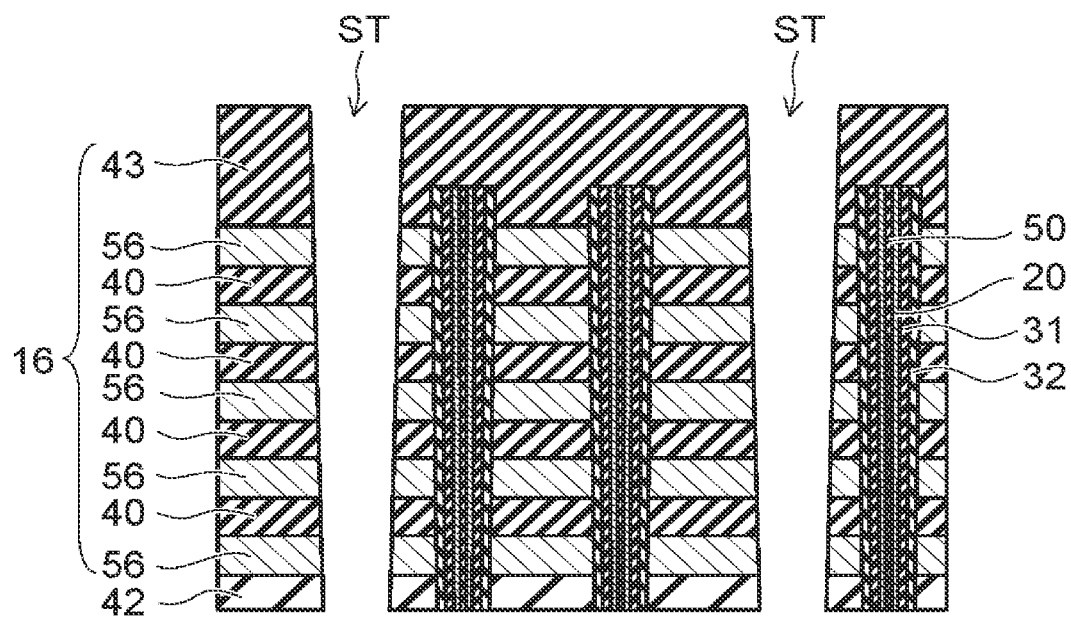

As shown in FIG. 21, the insulating layer 43 is formed on the stacked body 16. The grooves ST piercing through the stacked body 16 in the stacking direction are formed.

Figure 22:
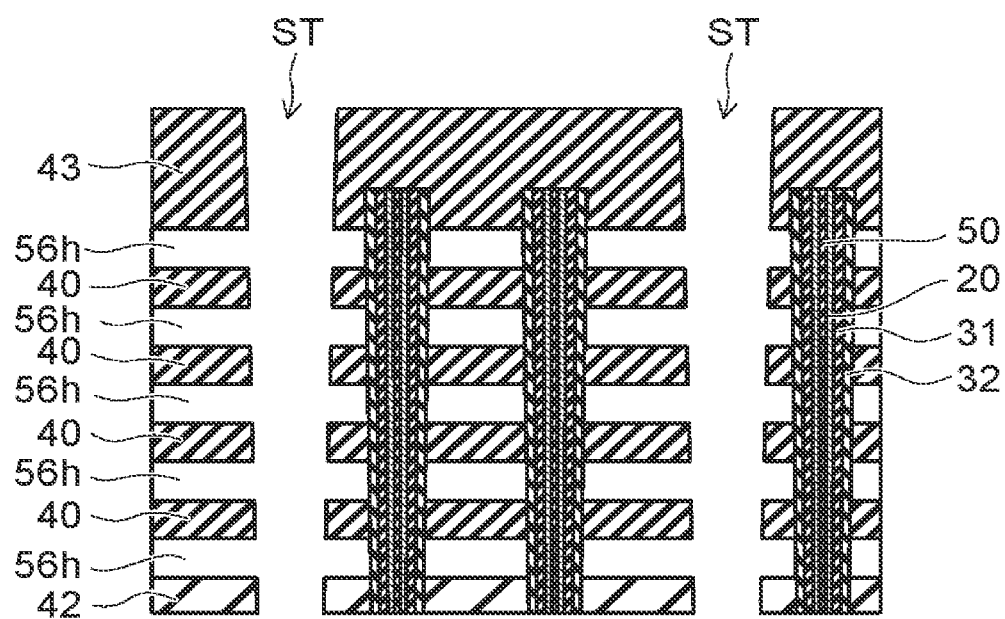

As shown in FIG. 22, the sacrificial layers 56 are removed through the grooves ST to form hollows 56h. As a method for removing the sacrificial layers 56, for example, a wet etching method is used. In this case, the stacked body 16 is supported by the columnar sections CL2.

Figure 23:
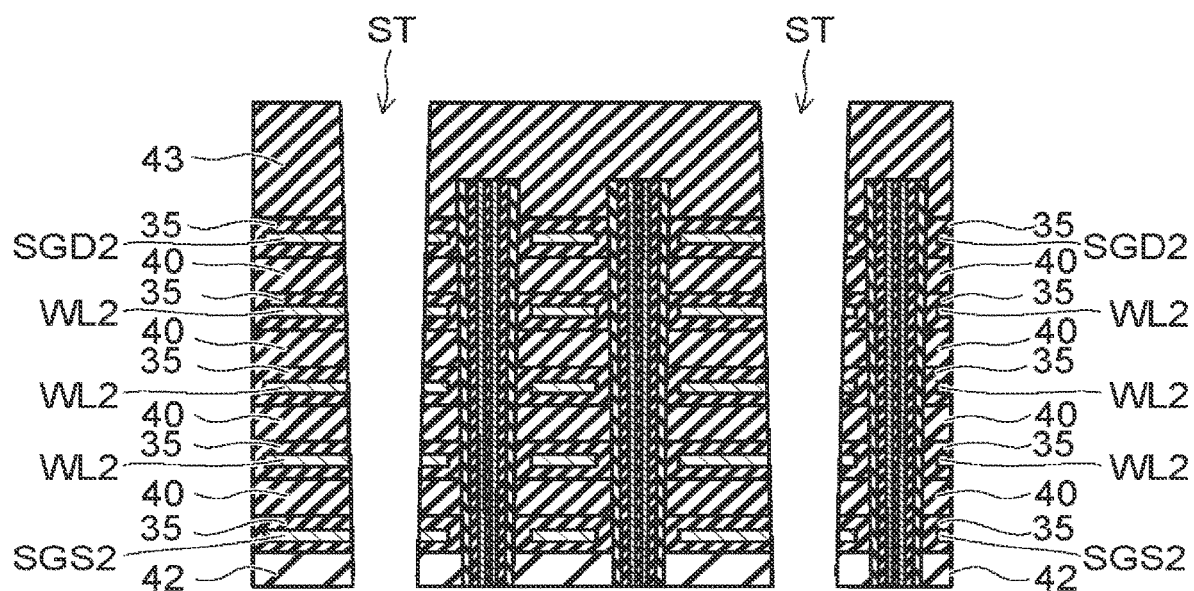

As shown in FIG. 23, the block insulating films 35 (the block films 33 and the cap films 34) are formed on the inner walls of the hollows 56h through the grooves ST. Thereafter, on the inner sides of the block insulating films 35, the cover layers WLc, the second metal layers WLb, and the first metal layers WLa are formed and the electrode layers WL2 are formed. Note that a method for forming a source side selection gate SGS2 and a drain side selection gate SGD2 is the same as the method for forming the electrode layers WL2. The source side selection gate SGS2 is formed under the stacked body 16. The drain side selection gate SGD2 is formed on the stacked body 16.

Thereafter, the semiconductor memory device in the embodiment including the memory cell array 2 is formed through processing same as the processes of the manufacturing method described above.

According to the embodiment, as in the embodiment described above, it is possible to realize reliability improvement and refining of the memory cells. Further, it is possible to realize a reduction in a block size and an increase in an electric current. It is possible to perform a high-speed operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a substrate;

an insulating layer provided above the substrate;

a stacked body provided above the insulating layer and including a plurality of electrode layers separately stacked from each other in a first direction;

a conductive layer provided between the insulating layer and the stacked body;

at least three semiconductor bodies extending in the first direction through the stacked body, including respective projecting portions projecting into the conductive layer in the first direction, and being electrically connected to the conductive layer at the respective projecting portions; and a memory portion provided between one of the at least three semiconductor bodies and one of the plurality of electrode layers, the conductive layer including a titanium nitride film and having at least three portions coupled to the respective projecting portions of the at least three semiconductor bodies, the at least three portions being not electrically isolated from one another.

2. The device according to claim 1, wherein the conductive layer further includes a polysilicon film.

3. The device according to claim 2, wherein the polysilicon film is in contact with the respective projecting portions of the at least three semiconductor bodies.

4. The device according to claim 2, wherein the conductive layer further includes a film including tungsten.

5. The device according to claim 4, wherein the film including tungsten is provided on the titanium nitride film in the conductive layer.

6. The device according to claim 4, wherein the polysilicon film is provided in an uppermost portion of the conductive layer.

7. The device according to claim 2, wherein the respective projecting portions of the at least three semiconductor bodies project into the polysilicon film of the conductive layer.

8. The device according to claim 1, wherein the conductive layer extends in a plane crossing the first direction and is not separated among the at least three portions in directions included in the plane.

9. The device according to claim 1, wherein the at least three semiconductor bodies include a first semiconductor body, a second semiconductor body, and a third semiconductor body, the first semiconductor body and the second semiconductor body being arranged in a second direction crossing the first direction, the first semiconductor body and the third semiconductor body being arranged in a third direction crossing the first direction and the second direction; and the first semiconductor body, the second semiconductor body, and the third semiconductor body are in contact with the conductive layer in common at the respective projecting portions.

10. The device according to claim 1, further comprising:
an insulator extending in the first direction through the stacked body to reach the conductive layer.

11. The device according to claim 10, wherein the insulator further extends in a second direction crossing the first direction and a bit line extending direction, the bit line being electrically connected to an upper end portion of one of the at least three semiconductor bodies above the stacked body.

12. A semiconductor memory device comprising:

a substrate;

an insulating layer provided above the substrate;

a stacked body provided above the insulating layer and including a plurality of electrode layers separately stacked from each other in a first direction;

a conductive layer provided between the insulating layer and the stacked body;

a semiconductor body extending in the first direction through the stacked body, including a projecting portion projecting into the conductive layer in the first direction, and being electrically connected to the conductive layer at the projecting portion;

a memory portion provided between the semiconductor body and one of the plurality of electrode layers; and a bit line electrically connected to an upper end portion of the semiconductor body above the stacked body, the stacked body being provided between the substrate and the bit line, the conductive layer including a titanium nitride film and being formed as a different body from the semiconductor body.

13. The device according to claim 12, wherein the conductive layer further includes a polysilicon film.

14. The device according to claim 13, wherein the polysilicon film is in contact with the projecting portion of the semiconductor body.

15. The device according to claim 13, wherein the conductive layer further includes a film including tungsten.

16. The device according to claim 15, wherein the film including tungsten is provided on the titanium nitride film in the conductive layer.

17. The device according to claim 16, wherein the polysilicon film is provided in an uppermost portion of the conductive layer.

18. The device according to claim 13, wherein the projecting portion of the semiconductor body projects into the polysilicon film of the conductive layer.

19. The device according to claim 12, further comprising:
an insulator extending in the first direction through the stacked body to reach the conductive layer.

20. The device according to claim 19, wherein the insulator further extends in a second direction crossing the first direction and the bit line extending direction.

* * * * *